US011521555B2

(12) United States Patent
Choi

(10) Patent No.: US 11,521,555 B2
(45) Date of Patent: Dec. 6, 2022

(54) GATE DRIVER CIRCUIT AND DISPLAY DEVICE INCLUDING THE SAME

(71) Applicant: LG DISPLAY CO., LTD., Seoul (KR)

(72) Inventor: Jaeyi Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/558,149

(22) Filed: Dec. 21, 2021

(65) Prior Publication Data
US 2022/0208113 A1 Jun. 30, 2022

(30) Foreign Application Priority Data
Dec. 31, 2020 (KR) .................. 10-2020-0189632

(51) Int. Cl.
*G09G 3/3266* (2016.01)
*G09G 3/3291* (2016.01)
*G09G 3/3233* (2016.01)

(52) U.S. Cl.
CPC ......... *G09G 3/3266* (2013.01); *G09G 3/3233* (2013.01); *G09G 3/3291* (2013.01); *G09G 2310/061* (2013.01); *G09G 2310/08* (2013.01)

(58) Field of Classification Search
None
See application file for complete search history.

(56) References Cited

U.S. PATENT DOCUMENTS

| 11,037,493 | B2 | 6/2021 | Chang | |
|---|---|---|---|---|
| 2016/0358586 | A1* | 12/2016 | Song | ................. G09G 5/12 |
| 2017/0115808 | A1* | 4/2017 | Cho | .................. G06F 3/0412 |
| 2020/0202779 | A1 | 6/2020 | Chang | |
| 2022/0206664 | A1* | 6/2022 | Jung | ................. G06F 3/04184 |

FOREIGN PATENT DOCUMENTS

KR 10-2020-0077197 A 6/2020

* cited by examiner

*Primary Examiner* — Christopher J Kohlman
(74) *Attorney, Agent, or Firm* — Morgan, Lewis & Bockius LLP

(57) ABSTRACT

Disclosed are a gate driver circuit having a reduced size, and a display device including the same. The gate driver circuit includes a plurality of stage blocks for outputting n gate signals (n is a positive integer). Each stage block includes each start stage circuit including a blank start circuit for receiving a block selection signal, and a signal output circuit for outputting a carry signal and a gate signal; and a plurality of normal stage circuits connected to each start stage circuit.

16 Claims, 15 Drawing Sheets

GATE DRIVER CIRCUIT AND DISPLAY DEVICE INCLUDING THE SAME

CROSS-REFERENCE TO RELATED APPLICATION

This application claims a benefit under 35 U.S.C. § 119(a) of Korean Patent Application No. 10-2020-0189632 filed on Dec. 31, 2020, on the Korean Intellectual Property Office, the entirety of disclosure of which is incorporated herein by reference for all purposes.

BACKGROUND

Technical Field

The present disclosure relates to a gate driver circuit and a display device including the same, and more particularly, to a gate driver circuit having a reduced size, and a display device including the same.

Discussion of the Related Art

Recently, a display device using a flat display panel such as a liquid crystal display device, an organic light-emitting display device, a light-emissive diode display device, and an electrical electrophoretic display device has been widely used.

A display device may include a pixel having a light-emissive element and a pixel circuit for driving the light-emissive element. For example, the pixel circuit includes a driving transistor that controls a driving current flowing through the light-emissive element, and at least one switching transistor that controls (or programs) a gate-source voltage of the driving transistor according to a gate signal. The switching transistor of the pixel circuit may be switched based on the gate signal output from a gate driver circuit disposed on a substrate of a display panel.

The display device includes a display area where an image is displayed and a non-display area where an image is not displayed. As a size of the non-display area decreases, a size of an edge area or a bezel area of a display device decreases while a size of the display area thereof increases.

SUMMARY

A gate driver circuit is disposed in the non-display area of the display device. As a size of the gate driver circuit decreases, a size of the display area increases.

The gate driver circuit includes a plurality of stage circuits. Each stage circuit includes a plurality of transistors for generating a gate signal. As the number of the transistors included in each stage circuit increases, a size of the stage circuit and thus a size of the gate driver circuit increase. Therefore, in order to reduce the size of the gate driver circuit and increase the size of the display area, it is necessary to reduce the number of the transistors included in each stage circuit.

Further, as the number of operations of a transistor included in each stage circuit increases, characteristics of the transistor, for example, a magnitude of a threshold voltage thereof change. Thus, as the magnitude of the threshold voltage thereof changes, a voltage drop at a control node occurs such that the transistor is not maintained in a completely turned-off state. Thus, leakage current occurs in each stage circuit during the operation of the gate driver circuit. When a gate signal is not output normally due to the leakage current, an image quality of the display device is deteriorated.

Accordingly, embodiments of the present disclosure are directed to a gate driver circuit and a display device including the same that substantially obviate one or more of the problems due to limitations and disadvantages of the related art.

An aspect of the present disclosure is to provide a gate driver circuit having a reduced size due to decrease in the number of transistors constituting a stage circuit and the number of lines connected to the transistors, and a display device including the same in which a display area thereof is increased.

A further aspect of the present disclosure is to provide a gate driver circuit capable of increasing an output speed of a gate signal for sensing a threshold voltage of a sub-pixel, thereby reducing a time required for the sensing the threshold voltage and compensation for deterioration of the sub-pixel, and to provide a display device including the same.

A yet further aspect of the present disclosure is to provide a gate driver circuit capable of preventing leakage of current during an operation of the gate driver circuit, thereby ensuring a normal output of a gate signal, and to provide a display device including the same in which deterioration of an image quality of the display device is prevented.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

A gate driver circuit according to one embodiment of the present disclosure includes a plurality of stage blocks for outputting n gate signals (n is a positive integer).

In one embodiment of the present disclosure, each stage block includes each start stage circuit including a blank start circuit for receiving a block selection signal, and a signal output circuit for outputting a carry signal and a gate signal; and a plurality of normal stage circuits connected to each start stage circuit, wherein each of the plurality of normal stage circuits includes each signal output circuit identical with the signal output circuit of each start stage circuit.

Further, a display device according to one embodiment of the present disclosure includes a display panel including sub-pixels respectively disposed at intersections of gate lines and data lines, a gate driver circuit for supplying a scan signal to each gate line, a data driver circuit for supplying a data voltage to each data line, and a timing controller that controls an operation timing of each of the gate driver circuit and the data driver circuit.

In one embodiment of the present disclosure, the gate driver circuit includes a plurality of stage blocks for outputting n gate signals (n is a positive integer).

In one embodiment of the present disclosure, each stage block includes each start stage circuit including a blank start circuit for receiving a block selection signal, and a signal output circuit for outputting a carry signal and a gate signal; and a plurality of normal stage circuits connected to each start stage circuit, wherein each of the plurality of normal stage circuits includes each signal output circuit identical with the signal output circuit of each start stage circuit.

According to one embodiment of the present disclosure, the number of the transistors constituting the stage circuit of the gate driver circuit and the number of lines connected to the transistors may be reduced, while stable operation of the gate driver circuit may be ensured. When the number of the transistors constituting the stage circuit decreases, the size of the gate driver circuit decreases, and thus the size of the display area of the display device increases. Further, a configuration and a design of the stage circuit become simpler due to the reduction in the number of the transistors constituting the stage circuit.

Further, according to one embodiment of the present disclosure, the gate signal for sensing the threshold voltage for compensation for deterioration of the sub-pixel is output more quickly. Accordingly, a time required for the sensing of the threshold voltage of the sub-pixel and a time required for compensating for the deterioration of the sub-pixel are reduced.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
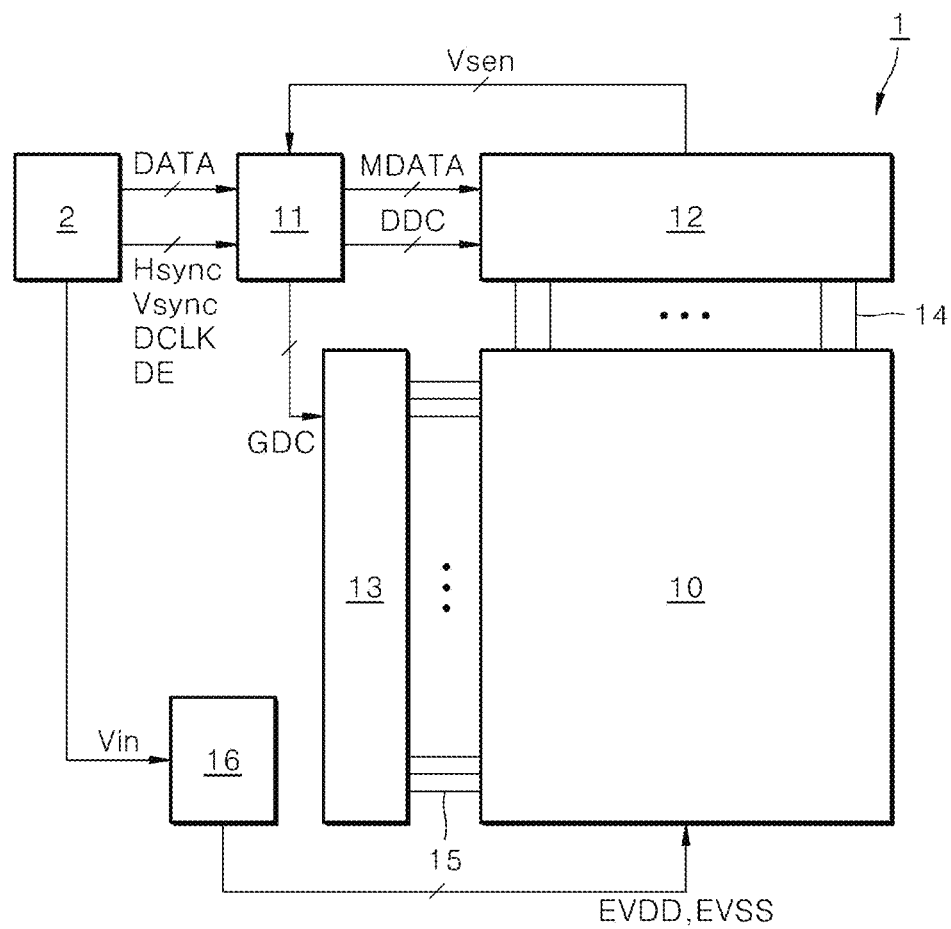
FIG. 1 is a block diagram showing an entire configuration of a display device according to one embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be within the spirit and scope of the present disclosure as defined by the appended claims.

A shape, a size, a ratio, an angle, a number, etc. disclosed in the drawings for describing an embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular may constitute "a" and "an" are intended to include the plural may constitute as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The features of the various embodiments of the present disclosure may be partially or entirely combined with each other, and may be technically associated with each other or operate with each other. An embodiments may be implemented independently of each other and may be implemented together in an association relationship.

In interpreting a numerical value in the disclosure, an error range may be inherent even when there is no separate explicit description thereof In a description of a signal flow relationship, for example, when a signal is transmitted from a node A to a node B, the signal may be transmitted from the node A via a node C to the node B, unless an indication that the signal is transmitted directly from the node A to the node B is specified.

In accordance with the present disclosure, each of a sub-pixel circuit and a gate driver circuit formed on a substrate of a display panel may be embodied as a transistor of an n-type MOSFET structure. However, the disclosure is not limited thereto. Each of a sub-pixel circuit and a gate driver circuit formed on a substrate of a display panel may be embodied as a transistor of a p-type MOSFET structure. A transistor may include a gate, a source, and a drain. In the transistor, carriers may flow from the source to the drain. In an n-type transistor, the carrier is an electron and thus a source voltage may be lower than a drain voltage so that electrons may flow from the source to the drain. In an n-type transistor, electrons flow from the source to the drain. A current direction is a direction from the drain to the source. In a p-type transistor, the carrier is a hole. Thus, The source voltage may be higher than the drain voltage so that holes may flow from the source to the drain. In the p-type transistor, the holes flow from the source to the drain. Thus, a direction of current is a direction from the source to the drain. In the transistor of the MOSFET structure, the source and the drain may not be fixed, but may be changed according to an applied voltage. Accordingly, in the present disclosure, one of the source and the drain is referred to as a first source/drain electrode, and the other of the source and the drain is referred to as a second source/drain electrode.

Hereinafter, a preferred example of a gate driver circuit and a display device including the same according to the present disclosure will be described in detail with reference to the accompanying drawings. Across different drawings, the same elements may have the same reference numerals. Moreover, each of scales of components shown in the accompanying drawings is shown to be different from an actual scale for convenience of description. Thus, each of scales of components is not limited to a scale shown in the drawings.

Figure 2:
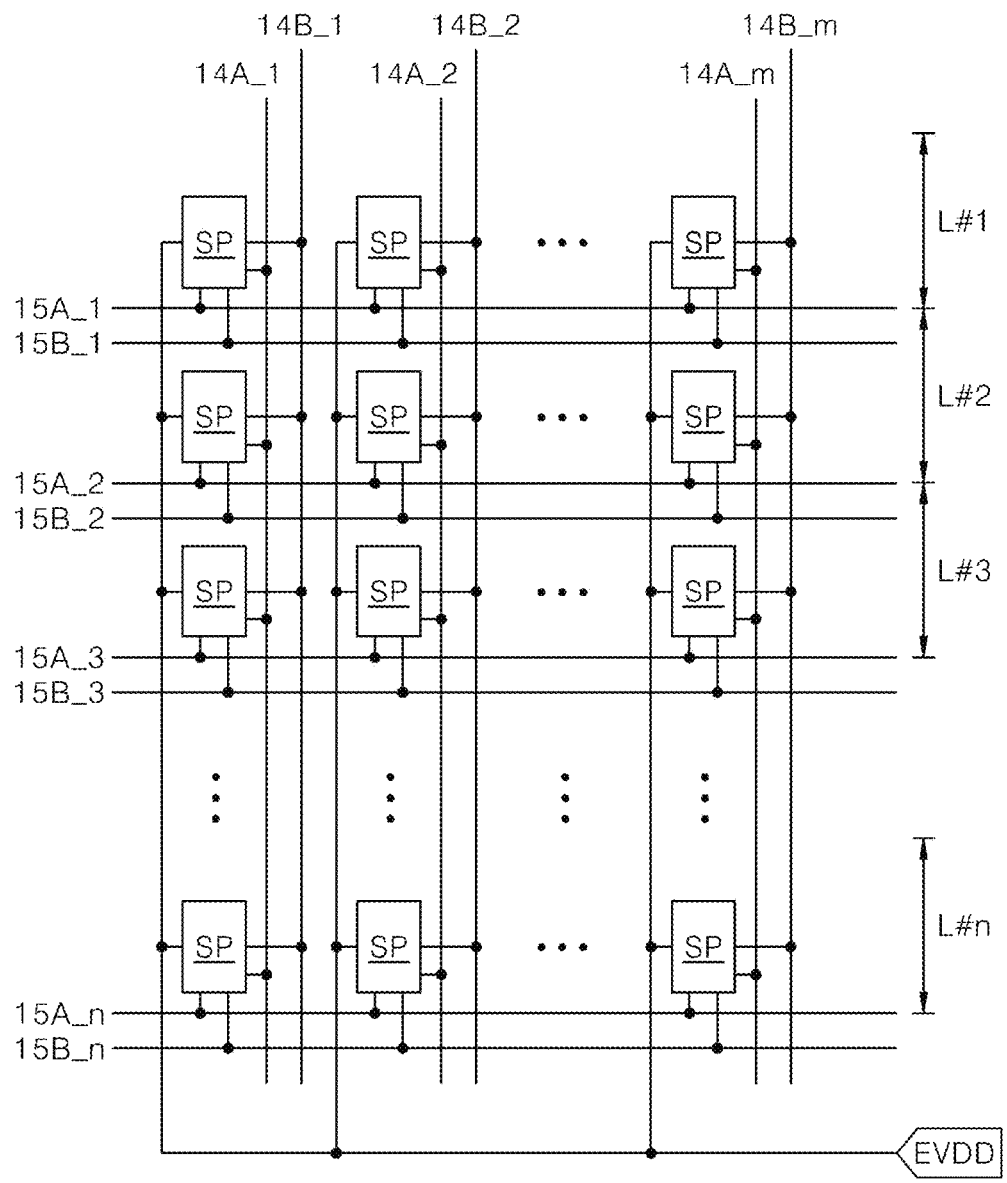
FIG. 2 shows a configuration of a sub-pixel array included in a display panel according to one embodiment of the present disclosure.

FIG. 1 is a block diagram showing a configuration of a display device according to one embodiment of the present disclosure. FIG. 2 shows a configuration of a sub-pixel array included in a display panel according to one embodiment of the present disclosure.

Referring to FIG. 1 and FIG. 2, a display device 1 according to one embodiment of the present disclosure includes a display panel 10, a data driver circuit 12, a gate driver circuit 13, and a timing controller 11.

A plurality of data lines 14 and a plurality of gate lines 16 are arranged to intersect each other and on the display panel 10. Further, sub-pixels SP are arranged in a matrix form and are respectively disposed at intersections of the data lines 14 and the gate lines 16.

The data lines 14 includes m data voltage supply lines 14A_1 to 14A_m (m being a positive integer) and m sensed voltage readout lines 14B_1 to 14B_m. Moreover, the gate lines 15 include n (n being positive integer) first gate lines 15A_1 to 15A_n and n second gate lines 15B_1 to 15B_n.

Each sub-pixel SP may be connected to one of the data voltage supply lines 14A_1 to 14A_m, one of the sensed voltage readout lines 14B_1 to 14B_m, one of the first gate lines 15A_1 to 15A_n, and one of the second gate lines 15B_1 to 15B_n. The sub-pixels SP may display different colors. A certain number of sub-pixel SPs may constitute one pixel P.

Each sub-pixel SP may receive a data voltage through the data voltage supply line, may receive a first gate signal through the first gate line, may receive a second gate signal through the second gate line, and may outputs a sensed voltage through the sensed voltage readout line.

That is, in the sub-pixel array shown in FIG. 2, the sub-pixels SP may operate on one horizontal line L#1 to L#n basis in response to the first gate signal supplied on a horizontal line basis from the first gate lines 15A_1 to 15A_n and the second gate signal supplied on a horizontal line basis from the second gate lines 15B_1 to 15B_n. Sub-pixels SP on the same horizontal line on which a sensing operation is activated may receive a data voltage for sensing a threshold voltage from the data voltage supply lines 14A_1 to 14A_m and outputs a sensed voltage to the sensed voltage readout lines 14B_1 to 14B_m. Each of the first gate signal and the second gate signal may be a gate signal for sensing the threshold voltage or a gate signal for displaying an image, respectively. The present disclosure is not limited thereto.

Each sub-pixel SP may receive a high-potential voltage EVDD and a low-potential voltage EVSS from a power management circuit 16. The sub-pixel SP may include an organic light emitting diode (OLED), a driving transistor, first and second switching transistors, and a storage capacitor. According to an embodiment, a light source other than the OLED may be included in the sub-pixel SP.

Each of the transistors constituting the sub-pixel SP may be implemented as a p-type or n-type transistor. Further, a semiconductor layer of each of the transistors constituting the sub-pixel SP may include amorphous silicon or poly-silicon or an oxide.

During the image display operation, the data driver circuit 12 converts compensated image data MDATA input from the timing controller 11 based on a data control signal DDC into a data voltage for image display and supplies the converted data voltage to the data voltage supply lines 14A_1 to 14A_m.

During a sensing operation for sensing a threshold voltage of the driving transistor, the data driver circuit 12 may transmit a data voltage for sensing the threshold voltage to the sub-pixels SP, based on the first gate signal for sensing the threshold voltage supplied on a horizontal line basis and may convert a sensed voltage input from the display panel 10 via the sensed voltage readout lines 14B_1 to 14B_m into a digital value and may supply the converted digital value to the timing controller 11.

The gate driver circuit 13 generates the gate signal based on a gate control signal GDC. The gate signal may include the first gate signal for sensing the threshold voltage, the second gate signal for sensing the threshold voltage, a first gate signal for displaying an image, and a second gate signal for displaying an image.

During the sensing operation, the gate driver circuit 13 may supply the first gate signal for sensing the threshold voltage to the first gate lines 15A_1 to 15A_n on a horizontal line basis, and may supply the second gate signal for sensing the threshold voltage to the second gate lines 15B_1 to 15B_n on a horizontal line basis. During the image display operation for image display, the gate driver circuit 13 may supply the first gate signal to display the image to the first gate lines 15A_1 to 15A_n on a horizontal line basis, and may supply the second gate signal to display the image to the second gate lines 15B_1 to 15B_n on a horizontal line basis. In one embodiment of the present disclosure, the gate driver circuit 13 may be disposed on the display panel 10 in a GIP (Gate-driver In Panel) scheme.

The timing controller 11 may generate and output the data control signal DDC for controlling an operation timing of the data driver circuit 12 and the gate control signal GDC for controlling an operation timing of the gate driver circuit 13, based on timing signals such as a vertical synchronization signal Vsync, a horizontal synchronization signal Hsync, a dot clock signal DCLK, and a data enable signal DE which are transmitted from a host system 2. Further, the timing controller 11 compensates image data DATA transmitted from the host system 2 based on a sensed value supplied from the data driver circuit 12 to generate compensated image data MDATA for compensating for a threshold voltage deviation of the driving transistor, and supplies the compensated image data MDATA to the data driver circuit 12.

The power management circuit 16 generates and supplies a voltage necessary for operation of the display device 1 based on the power supplied from the host system 2. In one embodiment of the present disclosure, the power management circuit 16 generates a driving voltage EVDD and a base voltage EVSS necessary for the operation of each sub-pixel SP, based on an input voltage Vin supplied from the host system 2, and supplies the driving voltage EVDD and the base voltage EVSS to the display panel 10. In still another example, the power management circuit 16 may generate a gate driving voltage GVDD and a gate base voltage GVSS necessary for operation of the gate driver circuit 13, and supply the gate driving voltage GVDD and the gate base voltage GVSS to the gate driver circuit 13.

Figure 3:
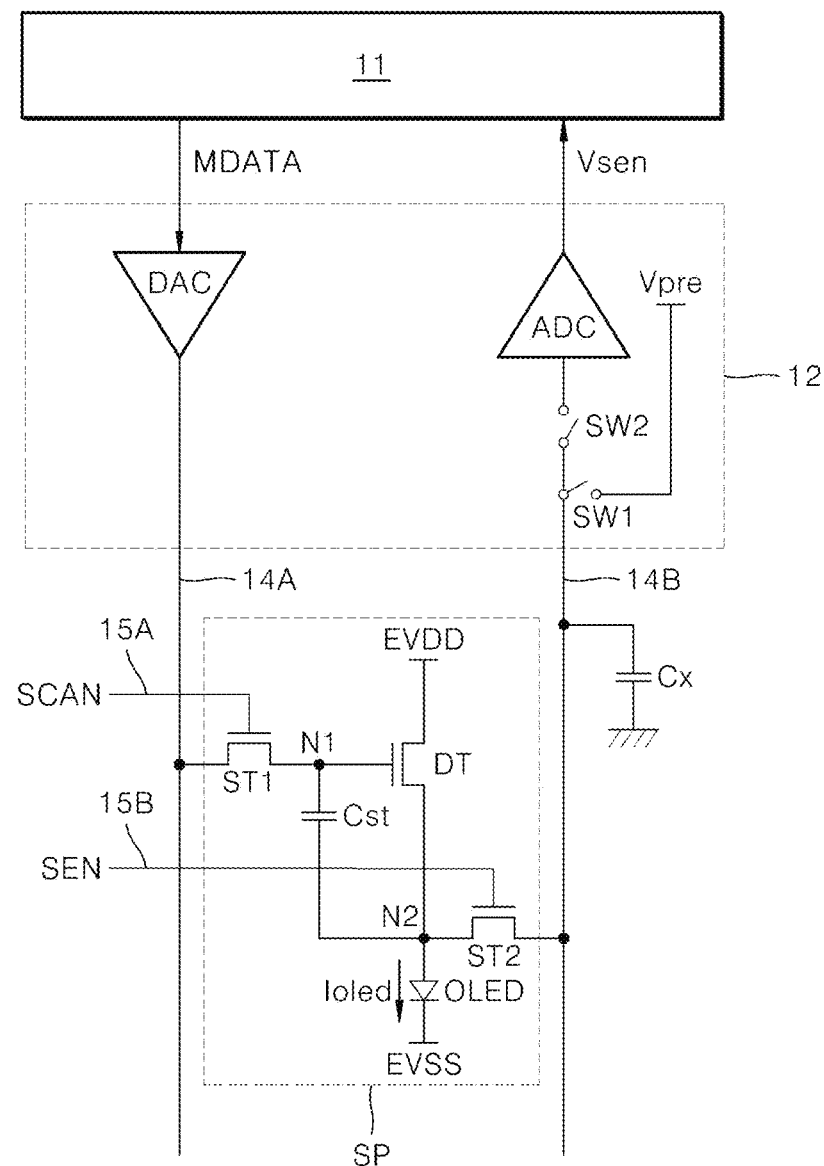
FIG. 3 shows a configuration of a sub-pixel circuit, and a connection structure between a timing controller, a data driver circuit, and a sub-pixel according to one embodiment of the present disclosure.

FIG. 3 shows a configuration of a sub-pixel circuit, and a connection structure between a timing controller, a data driver circuit, and a sub-pixel according to one embodiment of the present disclosure.

Referring to FIG. 3, the sub-pixel SP includes the OLED, the driving transistor DT, the storage capacitor Cst, the first switching transistor ST, and the second switching transistor ST2.

The OLED includes an anode connected to a second node N2, a cathode connected to an input side of a low-potential driving voltage EVSS, and an organic compound layer located between the anode and the cathode.

The driving transistor DT is turned on based on a gate-source voltage Vgs to control a current Ioled flowing through the OLED. The driving transistor DT includes a gate electrode connected to a first node N1, a drain electrode connected to an input side of a high-potential driving voltage EVDD, and a source electrode connected to the second node N2.

The storage capacitor Cst is connected to and disposed between the first node N1 and the second node N2.

The first switching transistor ST1 applies a data voltage Vdata for sensing a threshold voltage as charged in the data voltage supply line 14A to the first node N1 in response to the first gate signal SCAN for sensing the threshold voltage, during the sensing operation.

The first switching transistor ST1 applies a data voltage Vdata for displaying an image charged in the data voltage supply line 14A to the first node N1 in response to the first gate signal SCAN for displaying the image, during an image display operation. The first switching transistor ST1 includes a gate electrode connected to the first gate line 15A, a drain electrode connected to the data voltage supply line 14A, and a source electrode connected to the first node N1.

During the sensing operation, the second switching transistor ST2 switches a current flow between the second node N2 and the sensed voltage readout line 14B in response to the second gate signal SEN for sensing the threshold voltage such that a source voltage of the second node N2 which changes based on a gate voltage of the first node N1 is stored in a sensing capacitor Cx of the sensed voltage readout line 14B.

During the image display operation, the second switching transistor ST2 switches a current flow between the second node N2 and the sensed voltage readout line 14B in response to the second gate signal SEN for displaying the image to reset a source voltage of the driving transistor DT to an initialization voltage Vpre. The gate electrode of the second switching transistor ST2 may be connected to the second gate line 15B. The drain electrode of the second switching transistor ST2 may be connected to the second node N2. The source electrode of the second switching transistor ST2 may be connected to the sensed voltage readout line 14B.

The data driver circuit 12 is connected to the sub-pixel SP via the data voltage supply line 14A and the sensed voltage readout line 14B. The sensing capacitor Cx is connected to the sensed voltage readout line 14B to store therein a source voltage of the second node N2 as a sensed voltage Vsen. The data driver circuit 12 includes a digital-analog converter DAC, an analog-digital converter ADC, an initialization switch SW1, and a sampling switch SW2.

The DAC may generate the data voltage Vdata for sensing the threshold voltage at the same level or different levels for first and second periods of a sensing period under control of the timing controller 11 and output the generated data voltage to the data voltage supply line 14A. The DAC may convert the compensated image data MDATA to a data voltage Vdata for image display under control of the timing controller 11 for the image display period and output the converted data voltage to the data voltage supply line 14A.

The initialization switch SW1 switches current flow between an input side of the initialization voltage Vpre and the sensed voltage readout line 14B. The sampling switch SW2 switches current flow between the sensed voltage readout line 14B and the ADC. The ADC may convert an analog sensed voltage Vsen stored in the sensing capacitor Cx into a digital value and may supply the digital sensed value to the timing controller 11.

A sensing operation process performed under control of the timing controller 11 is as follows. For the sensing operation, when the first and second gate signals SCAN and SEN for sensing the threshold voltage are applied to the sub-pixel SP while being at an on level Lon, the first switching transistor ST1 and the second switching transistor ST2 are turned on. In this connection, the initialization switch SW1 in the data driver circuit 12 is turned on.

When the first switching transistor ST1 is turned on, the data voltage Vdata for sensing the threshold voltage is supplied to the first node N1. When the initialization switch SW1 and the second switching transistor ST2 are turned on, the initialization voltage Vpre is supplied to the second node N2. In this connection, the voltage Vgs between the gate and the source of the driving transistor DT becomes larger than a threshold voltage Vth, such that a current Ioled flows between the drain and the source of the driving transistor DT. A source voltage VN2 of the driving transistor DT charged in the second node N2 may gradually increase due to this current Ioled. Thus, the source voltage VN2 of the driving transistor DT may follow a gate voltage VN1 of the driving transistor DT until the gate-source voltage Vgs of the driving transistor DT becomes the threshold voltage Vth.

The source voltage VN2 of the driving transistor DT charged in the second node N2 in the increasing manner is stored as the sensed voltage Vsen in the sensing capacitor Cx formed in the sensed voltage readout line 14B via the second switching transistor ST2. The sensed voltage Vsen may be detected when the sampling switch SW2 in the data driver circuit 12 is turned on within the sensing period for which the second gate signal SEN for sensing the threshold voltage is maintained at the on level, and then the sensed voltage Vsen as detected may be supplied to the ADC.

The ADC converts the analog sensed voltage Vsen stored in the sensing capacitor Cx into a sensing value as a digital value, and supplies the digital sensed value to the timing controller 11.

In one embodiment of the present disclosure, the timing controller 11 may control the data driver circuit 12 and the gate driver circuit 13 so that a sensing operation on one horizontal line is performed for a blank period, that is, a period between a period for which one frame of the image data is displayed for the image display operation and a period in which one subsequent frame thereof is displayed.

The timing controller 11 compensates for the image data DATA based on the sensed value obtained by the data driver circuit 12 and generates the compensated image data MDATA. As the compensated image data MDATA is supplied to the data driver circuit 12, an image based on the compensated image data MDATA is displayed on the display panel 10.

Figure 4:
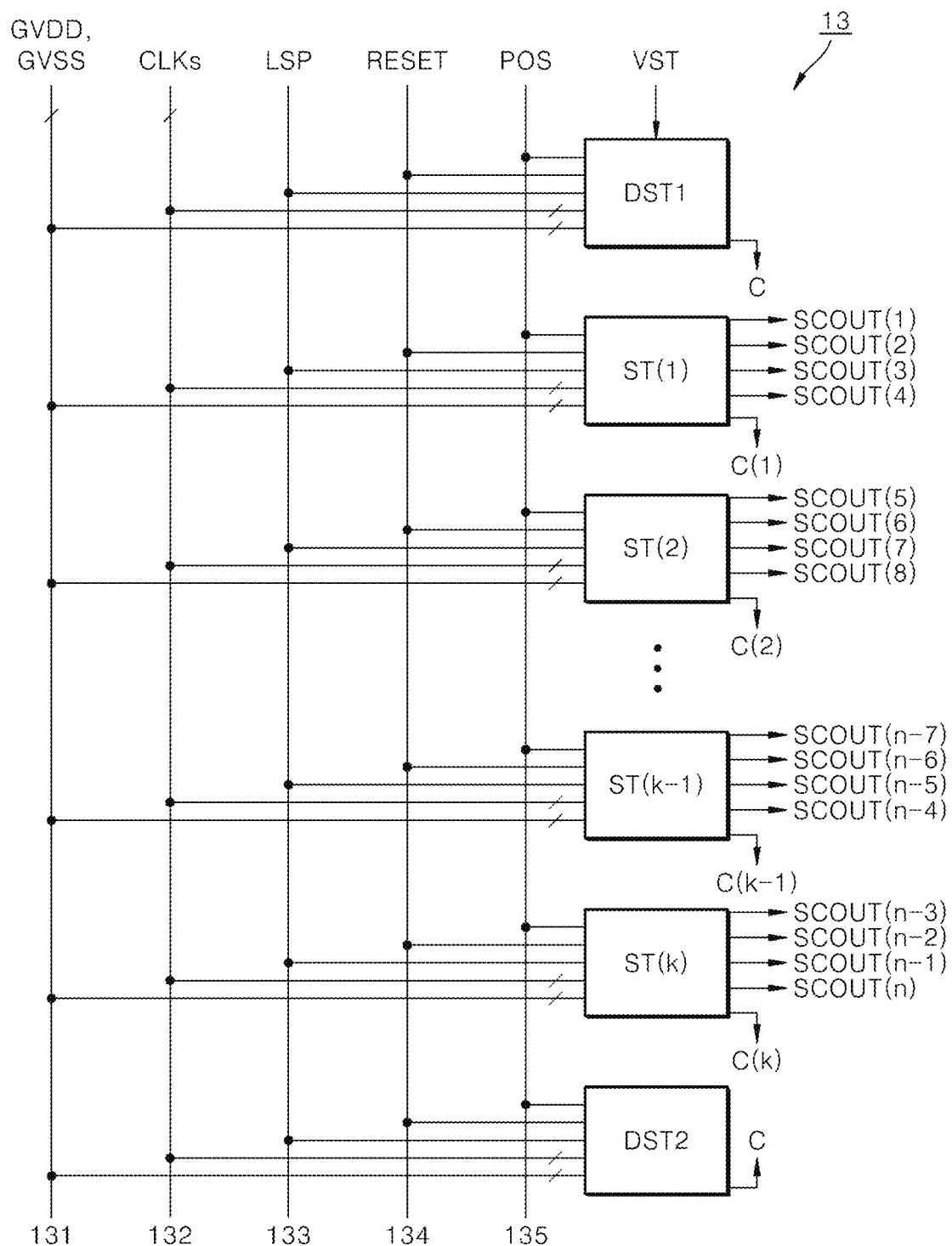
FIG. 4 shows a configuration of a plurality of stage circuits included in a gate driver circuit according to one embodiment of the present disclosure.

FIG. 4 shows a configuration of a plurality of stage circuits included in the gate driver circuit according to one embodiment of the present disclosure.

Referring to FIG. 4, the gate driver circuit 13 according to one embodiment of the present disclosure includes first to k-th stage circuits ST(1) to ST(k) (k is a positive integer), a gate driving voltage line 131, a clock signal line 132, a line sensing preparation signal line 133, a reset signal line 134, and a panel on signal line 135. Further, the gate driver circuit 13 may further include a front dummy stage circuit DST1 disposed in front of the first stage circuit ST(1) and a rear dummy stage circuit DST2 disposed in rear of the k-th stage circuit ST(k).

The gate driving voltage line 131 may supply a high-potential voltage GVDD and a low-potential voltage GVSS supplied from a power management circuit 16 to each of the first to k-th stage circuits ST(1) to ST(k), the front dummy stage circuit DST1, and the rear dummy stage circuit DST2.

In one embodiment of the present disclosure, the gate driving voltage line 131 may include a plurality of high-potential voltage lines for supplying a plurality of high-potential voltages having different voltage levels, respectively, and a plurality of low-potential voltage lines for supplying a plurality of low-potential voltages having different voltage levels, respectively.

In one example, the gate driving voltage line 131 has two high-potential voltage lines for supplying a first high-potential voltage GVDD1 and a second high-potential voltage GVDD2 having different voltage levels, respectively. The gate driving voltage line 131 has four low-potential voltage lines for supplying a first low-potential voltage GVSS1, a second low-potential voltage GVSS2, a third low-potential voltage GVSS3, and a fourth low-potential voltage GVSS4 having different voltage levels, respectively. However, this is only one example. The number of the voltage lines included in the gate driving voltage line 131 may vary based on embodiments.

The clock signal line 132 may supply a plurality of clock signals CLKs supplied from the timing controller 11, for example, a carry clock signal CRCLK or a scan clock signal SCCLK to each of the first to k-th stage circuits ST(1) to ST(k), the front dummy stage circuit DST1 and the rear dummy stage circuit DST2.

The line sensing preparation signal line 133 may supply a line sensing preparation signal LSP supplied from the timing controller 11 to the first to k-th stage circuits ST(1) to ST(k). Optionally, the line sensing preparation signal line 133 may be further connected to the front dummy stage circuit DST1.

The reset signal line 134 may supply a reset signal RESET supplied from the timing controller 11 to each of the first to k-th stage circuits ST(1) to ST(k), the front dummy stage circuit DST1, and the rear dummy stage circuit DST2.

The panel on signal line 135 may supply a panel on signal POS supplied from the timing controller 11 to each of the first to k-th stage circuits ST(1) to ST(k), the front dummy stage circuit DST1, and the rear dummy stage circuit DST2.

Although not shown, lines for supplying signals other than the lines 131, 132, 133, 134, and 135 as shown in FIG. 4 may be additionally connected to the first to k-th stage circuits ST(1) to ST(k), the front dummy stage circuit DST1, and the rear dummy stage circuit DST2. In one example, a line for supplying a gate start signal VST to the front dummy stage circuit DST1 may be additionally connected to the front dummy stage circuit DST1.

The front dummy stage circuit DST1 outputs a front carry signal C in response to an input of the gate start signal VST supplied from the timing controller 11. The front carry signal C may be supplied to one of the first to k-th stage circuits ST(1) to ST(k).

The rear dummy stage circuit DST2 outputs a rear carry signal C. The rear carry signal C may be supplied to one of the first to k-th stage circuits ST(1) to ST(k).

The first to k-th stage circuits ST(1) to ST(k) may be connected to each other in a cascaded manner or in a stepped manner.

In one embodiment of the present disclosure, each of the first to k-th stage circuits ST(1) to ST(k) outputs j (j is a positive integer) gate signals SCOUT and one carry signal C. That is, each stage circuit outputs first to j-th gate signals and one carry signal C.

For example, in an embodiment shown in FIG. 4, each stage circuit outputs four gate signals SCOUT and one carry signal C. For example, the first stage circuit ST(1) outputs a first gate signal SCOUT(1), a second gate signal SCOUT(2), a third gate signal SCOUT(3), a fourth gate signal SCOUT(4) and a first carry signal C(1). The second stage circuit ST 2 outputs a fifth gate signal SCOUT(5), a sixth gate signal SCOUT(6), a seventh gate signal SCOUT(7), an eighth gate signal SCOUT(8), and a second carry signal C(2). Therefore, in FIG. 8, j is 4.

The total number of the gate signals output from the first to k-th stage circuits ST(1) to ST(k) is equal to the number n of the gate lines 15 arranged on the display panel 10. As described above, each stage circuit outputs the j gate signals. Therefore, j×k=n is established.

For example, in the embodiment shown in FIG. 4 in which j=4, the number k of the stage circuits is equal to ¼ of the number n of the gate lines 15. That is, in the embodiment of FIG. 4, k=n/4.

However, the number of the gate signals output from each stage circuit is not limited thereto. That is, in another embodiment of the present disclosure, each stage circuit may output one, two, or threes gate signals, or may output five or more gate signals. The number of the stage circuits may vary according to the number of the gate signals output from each stage circuit. For example, when each stage circuit outputs one gate signal and the number of the gate lines 15 is n, the gate driver circuit 13 includes n stage circuits. In still another example, when each stage circuit outputs 4 gate signals and the number of the gate lines 15 included in the display panel 106 is n, the gate driver circuit 13 includes n/4 stage circuits.

Hereinafter, an embodiment in which each stage circuit outputs four gate signals SCOUT and one carry signal C will be described. However, the present disclosure is not limited to this embodiment.

Each of the gate signals SCOUT output from the first to k-th stage circuits ST(1) to ST(k) may act as the gate signal for sensing the threshold voltage or the gate signal for displaying the image. Further, each carry signal C output from each of the first to k-th stage circuits ST(1) to ST(k) may be supplied to a stage circuit other than each stage circuit. In accordance with the present disclosure, a carry signal which one stage circuit receives from the front stage circuit may be referred to as the front carry signal, while a carry signal which one stage circuit receives from the rear stage circuit may be referred to as the rear carry signal.

Figure 5:
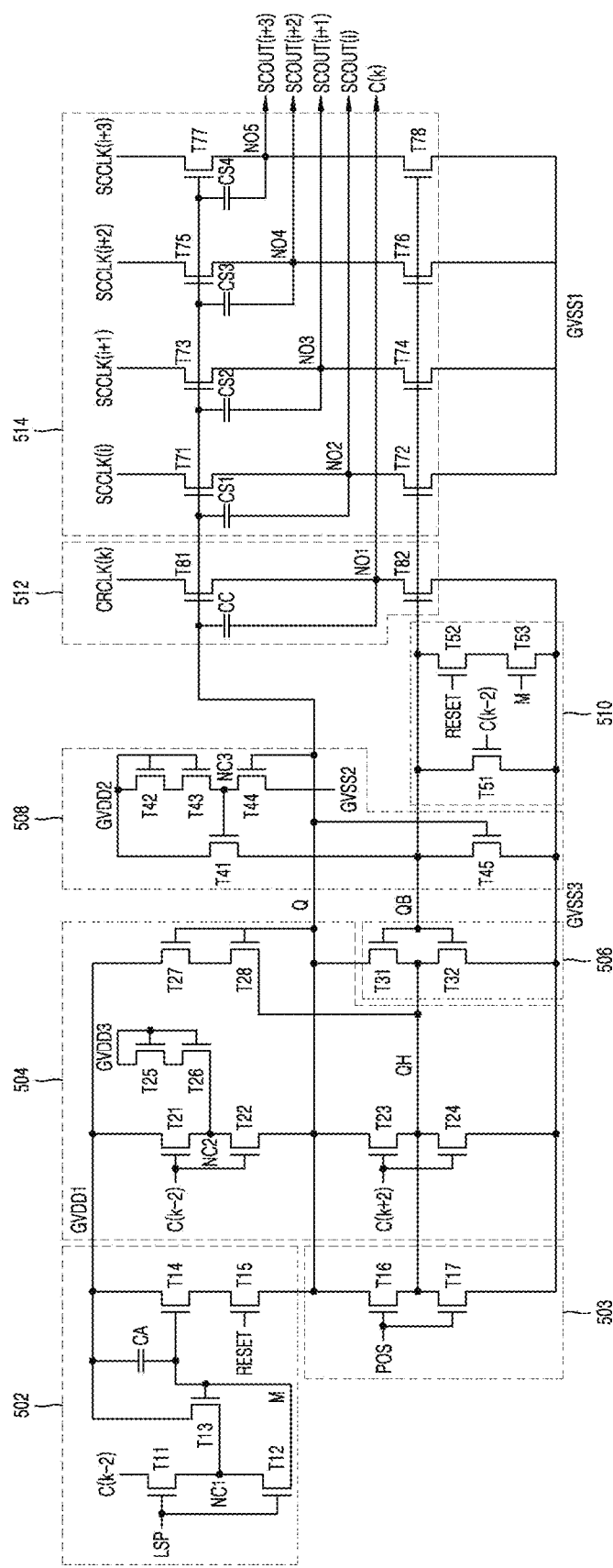
FIG. 5 is a circuit diagram of a stage circuit according to one embodiment of the present disclosure.

FIG. 5 is a circuit diagram of a stage circuit according to one embodiment of the present disclosure.

The stage circuit shown in FIG. 5 may be one stage circuit among the first to k-th stage circuits ST(1) to ST(k) shown in FIG. 4.

Referring to FIG. 5, the stage circuit according to one embodiment of the present disclosure includes an M node, a Q node, and a QB node. Further, the stage circuit according to one embodiment of the present disclosure includes a line selector 502, an initializer 503, a Q node controller 504, a Q node and QH node stabilizer 506, an inverter 508, a QB node stabilizer 510, a carry signal output module 512, and a gate signal output module 514.

The line selector 502 charges the M node based on the front carry signal C(k–2) in response to an input of the line sensing preparation signal LSP. Further, the line selector 502 charges the Q node to a first high-potential voltage GVDD1 level based on a charged voltage of the M node in response to an input of the reset signal RESET.

The initializer 503 discharges or resets the Q node to a third low-potential voltage GVSS3 level in response to an input of the panel on signal POS.

The line selector 502 includes first to fifth transistors T11 to T15 and a pre-charging capacitor CA.

The initializer 503 includes sixth and seventh T16 and T17.

The first transistor T11 and the second transistor T12 are connected to and disposed between a first high-potential voltage line for delivering the first high-potential voltage GVDD1 and the M node. Further, the first transistor T11 and the second transistor T12 are connected in series with each other.

The first transistor T11 outputs a front carry signal C(k–2) to a first connection node NC1 in response to an input of the line sensing preparation signal LSP. The second transistor T12 electrically connects the first connection node NC1 to the M node in response to an input of the line sensing preparation signal LSP. For example, when the line sensing preparation signal LSP of a high level voltage is input to the first transistor T11 and the second transistor T12, the first transistor T11 and the second transistor T12 are simultaneously turned on to charge the M node to the first high-potential voltage GVDD1 level.

The third transistor T13 may be turned on when a voltage level of the M node is at a high level, and thus may supply the first high-potential voltage GVDD1 to the first connection node NC1. When the first high-potential voltage GVDD1 is supplied to the first connection node NC1, a difference between a gate voltage of the first transistor T11 and a volage of the first connection node NC1 increases. Therefore, when the line sensing preparation signal LSP of a low level voltage is input to a gate of the first transistor T11 such that the first transistor T11 is turned off, the first transistor T11 may be maintained in a completely turned off state due to the difference between the gate voltage of the first transistor T11 and the voltage of the first connection node NC1. Accordingly, current leakage of the first transistor T11 and thus, voltage drop of the M node may be prevented, so that the voltage of the M node may be stably maintained.

The pre-charging capacitor CA is connected to and disposed between the first high-potential voltage line for delivering the first high-potential voltage GVDD1 and the M node, and stores therein a voltage corresponding to a difference between the first high-potential voltage GVDD1 and a voltage charged to the M node. When the first transistor T11, the second transistor T12, and the third transistor T13 are turned on, the pre-charging capacitor CA stores therein a high level voltage of the front carry signal C(k–2). When the first transistor T11, the second transistor T12, and the third transistor T13 are turned off, the pre-charging capacitor CA maintains the voltage of the M node using the voltage stored therein for a certafor a period of time.

The fourth transistor T14 and the fifth transistor T15 are connected to and disposed between the Q node and the first high-potential voltage line for delivering the first high-potential voltage GVDD1. The fourth transistor T14 and the fifth transistor T15 are connected in series with each other.

The fourth transistor T14 and the fifth transistor T15 charge the Q node to the first high-potential voltage GVDD1 in response to the voltage of the M node and an input of the reset signal RESET. The fourth transistor T14 may be turned on when the voltage of the M node is at a high level, and thus may transmit the first high-potential voltage GVDD1 to a shared node between the fourth transistor T14 and the fifth transistor T15. The fifth transistor T15 may be turned on based on a high level reset signal RESET to supply the voltage of the shared node to the Q node. Therefore, when the fourth transistor T14 and the fifth transistor T15 are simultaneously turned on, the Q node is charged with the first high-potential voltage GVDD1.

The sixth transistor T16 and the seventh transistor T17 are connected to and disposed between the Q node and a third low-potential voltage line that may transmit the third low-potential voltage GVSS3. The sixth transistor T16 and the seventh transistor T17 are connected in series to each other.

The sixth transistor T16 and the seventh transistor T17 discharge the Q node to the third low-potential voltage GVSS3 in response to an input of the panel on signal POS. The Q node being discharged to the third low-potential voltage GVSS3 may also be referred to as the Q node being reset. The seventh transistor T17 may be turned on based on an input of a high level panel on signal POS to supply the third low-potential voltage GVSS3 to the QH node. The sixth transistor T16 is turned on based on an input of the high level panel-on signal POS to electrically connect the Q node and the QH node to each other. Therefore, when the sixth transistor T16 and the seventh transistor T17 are simultaneously turned on, the Q node is discharged or reset to the third low-potential voltage GVSS3.

The Q node controller 504 charges the Q node to the first high-potential voltage GVDD1 level, in response to an input of the front carry signal C(k−2), and discharges the Q node to the third low-potential voltage GVSS3 level, in response to an input of the rear carry signal C(k+2).

The Q node controller 504 includes first to eighth transistors T21 to T28.

The first transistor T21 and the second transistor T22 are connected to and disposed between the Q node and the first high-potential voltage line for delivering the first high-potential voltage GVDD1. The first transistor T21 and the second transistor T22 are connected in series with each other.

The first transistor T21 and the second transistor T22 charge the Q node to the first high-potential voltage GVDD1 level in response to an input of the front carry signal C(k−2). The first transistor T21 may be turned on based on an input of the front carry signal C(k−2) and thus may supply the first high-potential voltage GVDD1 to the second connection node NC2. The second transistor T22 may be turned on based on an input of the front carry signal C(k−2) and may electrically connect the second connection node NC2 and the Q node to each other. Therefore, when the first transistor T21 and the second transistor T22 are simultaneously turned on, the first high-potential voltage GVDD1 is supplied to the Q node.

A fifth transistor T25 and a sixth transistor T26 are connected to the third high-potential voltage line for delivering the third high-potential voltage GVDD3. The fifth transistor T25 and the sixth transistor T26 supply the third high-potential voltage GVDD3 to a second connection node NC2 in response to the third high-potential voltage GVDD3.

The fifth transistor T25 and the sixth transistor T26 are turned on at the same time based on the third high-potential voltage GVDD3, such that the third high-potential voltage GVDD3 is constantly supplied to the second connection node NC2, thereby increasing a difference between the gate voltage of the first transistor T21 and a voltage of the second connection node NC2. Therefore, when a low level front carry signal C(k−2) is input to the gate of the first transistor T21 and thus, the first transistor T21 is turned off, the first transistor T21 may be maintained in a completely turned-off state due to the difference between the gate voltage of the first transistor T21 and the voltage of the second connection node NC2. Accordingly, the current leakage of the first transistor T21 and thus, the voltage drop of the Q node may be prevented, so that the voltage of the Q node may be stably maintained.

In one example, when a threshold voltage of the first transistor T21 is negative (−), the gate-source voltage Vgs of the first transistor T21 is maintained to be negative (−) due to the third high-potential voltage GVDD3 supplied to the drain electrode. Therefore, when the low level front carry signal C(k−2) is input to the gate of the first transistor T21 and thus the first transistor T21 is turned off, the first transistor T21 may be maintained in a completely turned off state to prevent the leakage current therefrom.

In one embodiment of the present disclosure, the third high-potential voltage GVDD3 is set to a lower voltage level than that of the first high-potential voltage GVDD1.

A third transistor T23 and a fourth transistor T24 are connected to and disposed between the Q node and the third low-potential voltage line for delivering the third low-potential voltage GVSS3. The third transistor T23 and the fourth transistor T24 are connected in series with each other.

The third transistor T23 and the fourth transistor T24 discharge the Q node and the QH node to the third low-potential voltage GVSS3 level in response to an input of the rear carry signal C(k+2). The fourth transistor T24 is turned on based on an input of the rear carry signal C(k+2) to discharge the QH node to the third low-potential voltage GVSS3 level. The third transistor T23 is turned on based on an input of the rear carry signal C(k+2) to electrically connect the Q node and the QH node to each other. Therefore, when the third transistor T23 and the fourth transistor T24 are simultaneously turned on, each of the Q node and the QH node is discharged or reset to the third low-potential voltage GVSS3 level.

A seventh transistor T27 and an eighth transistor T28 are connected to and disposed between the first high-potential voltage line for delivering the first high-potential voltage GVDD1 and the Q node, and are connected to and disposed between the first high-potential voltage line for delivering the first high-potential voltage GVDD1 and the QH node. The seventh transistor T27 and the eighth transistor T28 are connected in series with each other.

The seventh transistor T27 and the eighth transistor T28 supply the first high-potential voltage GVDD1 to the QH node in response to the voltage of the Q node. The seventh transistor T27 may be turned on when the voltage of the Q node is at a high level and thus may supply the first high-potential voltage GVDD1 to a shared node between the seventh transistor T27 and the eighth transistor T28. The eighth transistor T28 may be turned on when the voltage of the Q node is at a high level and thus may electrically connect the shared node and the QH node to each other. Therefore, the seventh transistor T27 and the eighth transistor T28 are simultaneously turned on when the voltage of the Q node is at a high level, such that the first high-potential voltage GVDD1 is supplied to the QH node.

When the first high-potential voltage GVDD1 is supplied to the QH node, a difference between the gate voltage of the third transistor T23 and the voltage of the QH node increases. Therefore, when the low level rear carry signal C(k+2) is input to the gate of the third transistor T23 and thus the third transistor T23 is turned off, the third transistor T23 may be maintained in a completely turned off state due to the difference between the gate voltage of the third transistor T23 and the voltage of the QH node. Accordingly, current leakage of the third transistor T23 and thus, the voltage drop of the Q node may be prevented, so that the voltage of the Q node may be stably maintained.

The Q node and QH node stabilizer 506 discharges the Q node and the QH node to the third low-potential voltage GVSS3 level in response to the voltage of the QB node.

The Q node and QH node stabilizer 506 includes a first transistor T31 and a second transistor T32. The first transistor T31 and the second transistor T32 are connected to and disposed between the Q node and the third low-potential voltage line for delivering the third low-potential voltage GVSS3. The first transistor T31 and the second transistor T32 are connected in series with each other.

The first transistor T31 and the second transistor T32 discharge the Q node and the QH node to the third low-potential voltage GVSS3 level in response to the voltage of the QB node. The second transistor T32 may be turned on when the voltage of the QB node is at a high level and thus may supply the third low-potential voltage GVSS3 to a shared node between the first transistor T31 and the second transistor T32. The first transistor T31 may be turned on when the voltage of the QB node is at a high level and thus may electrically connect the Q node and the QH node to each other. Therefore, when the first transistor T31 and the second transistor T32 are turned on simultaneously in response to the voltage of the QB node, each of the Q node and the QH node may be discharged or reset to the third low-potential voltage GVSS3 level.

The inverter 508 changes a voltage level of the QB node according to a voltage level of the Q node.

The inverter 508 includes first to fifth transistors T41 to T45.

A second transistor T42 and a third transistor T43 are connected to and disposed between a second high-potential voltage line for delivering the second high-potential voltage GVDD2 and a third connection node NC3. The second transistor T42 and the third transistor T43 are connected in series with each other.

The second transistor T42 and the third transistor T43 supply the second high-potential voltage GVDD2 to the third connection node NC3 in response to the second high-potential voltage GVDD2. The second transistor T42 is turned on based on the second high-potential voltage GVDD2 to supply the second high-potential voltage GVDD2 to a shared node between the second transistor T42 and the third transistor T43. The third transistor T43 is turned on based on the second high-potential voltage GVDD2 to electrically connect the shared node between the second transistor T42 and the third transistor T43 to the third connection node NC3. Therefore, when the second transistor T42 and the third transistor T43 are simultaneously turned on based on the second high-potential voltage GVDD2, the third connection node NC3 is charged to the second high-potential voltage GVDD2 level.

The fourth transistor T44 is connected to and disposed between the third connection node NC3 and the second low-potential voltage line for delivering the second low-potential voltage GVSS2.

The fourth transistor T44 may supply the second low-potential voltage GVSS2 to the third connection node NC3 in response to a voltage of the Q node. The fourth transistor T44 may be turned on when the voltage of the Q node is at a high level and thus may discharge or reset the third connection node NC3 to the second low-potential voltage GVSS2.

The first transistor T41 is connected to and disposed between the second high-potential voltage line for delivering the second high-potential voltage GVDD2 and the QB node.

The first transistor T41 may supply the second high-potential voltage GVDD2 to the QB node in response to a voltage of the third connection node NC3.

The first transistor T41 may be turned on when the voltage of the third connection node NC3 is at a high level and thus may charge the QB node to the second high-potential voltage GVDD2 level.

The fifth transistor T45 is connected to and disposed between the QB node and the third low-potential voltage line for delivering the third low-potential voltage GVSS3.

The fifth transistor T45 may supply the third low-potential voltage GVSS3 to the QB node in response to a voltage of the Q node. The fifth transistor T45 may be turned on when the voltage of the Q node is at a high level and thus may discharge or reset the QB node to the third low-potential voltage GVSS3 level.

The QB node stabilizer 510 discharges the QB node to the third low-potential voltage GVSS3 level in response to an input of the rear carry signal C(k−2), to an input of the reset signal, and to a charged voltage of the M node.

The QB node stabilizer 510 includes first to third transistor T51 to T53.

The first transistor T51 is connected to and disposed between the QB node and the third low-potential voltage line for delivering the third low-potential voltage GVSS3.

The first transistor T51 may supply a third low-potential voltage GVSS3 to the QB node in response to an input of the rear carry signal C(k−2). The fifth transistor T45 may be turned on when the voltage of the Q node is at a high level and thus may discharge or reset the QB node to the third low-potential voltage GVSS3 level.

The second transistor T52 and the third transistor T53 are connected to and disposed between the QB node and the third low-potential voltage line for delivering the third low-potential voltage GVSS3. The second transistor T52 and the third transistor T53 are connected in series with each other.

The second transistor T52 and the third transistor T53 discharge the QB node to the third low-potential voltage GVSS3 level in response to an input of the reset signal and a charged voltage of the M node. The third transistor T53 may be turned on when the voltage of the M node is at a high level and thus may supply the third low-potential voltage GVSS3 to a shared node between the second transistor T52 and the third transistor T53. The second transistor T52 may be turned on based on an input of the reset signal RESET, such that the shared node between the second transistor T52 and the third transistor T53 is electrically connected to the QB node. Therefore, when the reset signal RESET is input to the second transistor T52 and the third transistor T53 while the voltage of the M node is at a high level, the second transistor T52 and the third transistor T53 are turned on at the same time to discharge or reset the QB node to the third low-potential voltage GVSS3 level.

The carry signal output module 512 outputs the carry signal C(k) based on a voltage level of the carry clock signal CRCLK(k) or the third low-potential voltage GVSS3 level, according to a voltage level of the Q node or a voltage level of the QB node.

The carry signal output module 512 includes a first transistor T81, a second transistor T82, and a boosting capacitor CC.

The first transistor T81 is connected to and disposed between a clock signal line for delivering the carry clock signal CRCLK(k) and the QB node. The boosting capacitor CC is connected to and disposed between a gate and a source of the first transistor T81.

The first transistor T81 outputs a high level voltage carry signal C(k) through the first output node NO1, based on the carry clock signal CRCLK(k), in response to a voltage of the Q node. The first transistor T81 may be turned on when the voltage of the Q node is at a high level and thus may supply the carry clock signal CRCLK(k) of a high level voltage to the first output node NO1. Accordingly, the high level voltage carry signal C(k) is output.

When the carry signal C(k) is output, the boosting capacitor CC bootstraps a voltage of the Q node to a boosting voltage level higher than the first high-potential voltage GVDD1 level while being in synchronization with the carry clock signal CRCLK(k) of the high level voltage level. When the voltage of the Q node is bootstrapped, the high voltage level carry clock signal CRCLK(k) may be output as the carry signal C(k) quickly and without distortion.

The second transistor T82 is connected to and disposed between the first output node NO1 and the third low-potential voltage line for delivering the third low-potential voltage GVSS3.

The second transistor T82 outputs a low level voltage carry signal C(k) through the first output node NO1, based on the third low-potential voltage GVSS3, in response to a voltage of the QB node. The second transistor T82 may be turned on when the voltage of the QB node is at a high level and thus may supply the third low-potential voltage GVSS3 to the first output node NO1. Accordingly, the low level voltage carry signal C(k) is output.

The gate signal output module 514 may operate according to a voltage level of the Q node or a voltage level of the QB node to output a plurality of the gate signals SCOUT(i), SCOUT(i+1), SCOUT(i+2), and SCOUT(i+3), based on voltage levels of a plurality of scan clock signals SCCLK(i), SCCLK(i+1), SCCLK(i+2), and SCCLK(i+3), or the first low-potential voltage GVSS1 level. In this connection, i is a positive integer.

The gate signal output module 514 includes first to eighth transistors T71 to T78, and boosting capacitors CS1, CS2, CS3, and CS4.

A first transistor T71, a third transistor T73, a fifth transistor T75, and a seventh transistor T77 are respectively connected to and disposed between clock signal lines for respectively delivering scan clock signals SCCLK(i), SCCLK(i+1), SCCLK(i+2) and SCCLK(i+3) and the second to fifth output nodes NO2 to NO5. Each of the boosting capacitors CS1, CS2, CS3, and CS4 is connected to and disposed between a gate and a source of each of the first transistor T71, the third transistor T73, the fifth transistor T75, and the seventh transistor T77.

Each of the first transistor T71, the third transistor T73, the fifth transistor T75, and the seventh transistor T77 may operate in response to a voltage of the Q node to output each of high level voltage gate signals SCOUT(i), SCOUT(i+1), SCOUT(i+2), and SCOUT(i+3) based on each of the scan clock signals SCCLK(i), SCCLK(i+1), SCCLK(i+2), and SCCLK(i+3) via each of the second output node NO2, the third output node NO3, the fourth output node NO4, and the fifth output node NO5. Each of the first transistor T71, the third transistor T73, the fifth transistor T75, and the seventh transistor T77 may be turned on when the voltage of the Q node is at a high level and thus may supply each of the high level voltage scan clock signals SCCLK(i), SCCLK(i+1), SCCLK(i+2), and SCCLK(i+3) to each of the second output node NO2, the third output node NO3, the fourth output node NO4, and the fifth output node NO5. Accordingly, the high level voltage gate signals SCOUT(i), SCOUT(i+1), SCOUT(i+2), and SCOUT(i+3) are respectively output.

When the gate signals SCOUT(i), SCOUT(i+1), SCOUT(i+2), SCOUT(i+3) are respectively output, the boosting capacitors CS1, CS2, CS3, and CS4 bootstrap or increase the voltage of the Q node to a boosting voltage level higher than the first high-potential voltage GVDD1 level, while being respectively synchronized with the high level voltage scan clock signals SCCLK(i), SCCLK(i+1), SCCLK(i+2), and SCCLK(i+3). When the voltage of the Q node is bootstrapped, the high voltage level scan clock signals SCCLK(i), SCCLK(i+1), SCCLK(i+2), and SCCLK(i+3) may be respectively output as the gate signals SCOUT(i), SCOUT(i+1), SCOUT(i+2), and SCOUT(i+3) quickly and without distortion.

A second transistor T72, a fourth transistor T74, a sixth transistor T76, and an eighth transistor T78 may operate in response to a voltage of the QB node to respectively output low level voltage gate signals SCOUT(i), SCOUT(i+1), SCOUT(i+2), and SCOUT(i+3) based on the first low-potential voltage GVSS1 via the second output node NO2, the third output node NO3, the fourth output node NO4, and the fifth output node NO5. The second transistor T72, the fourth transistor T74, the sixth transistor T76, and the eighth transistor T78 may be respectively turned on when the voltage of the QB node is at a high level and thus may supply the first low-potential voltage GVSS1 to the second output node NO2, the third output node NO3, the fourth output node NO4, and the fifth output node NO5, respectively. Accordingly, the low level voltage gate signals SCOUT(i), SCOUT(i+1), SCOUT(i+2), and SCOUT(i+3) are respectively output.

In the embodiment shown in FIG. 5, each stage circuit may receive the three high-potential voltages GVDD1, GVDD2, and GVDD3 set to different levels, and the three low-potential voltages GVSS1, GVSS2, and GVSS3 set to different levels. For example, the first high-potential voltage GVDD1 may be set to 20V, the second high-potential voltage GVDD2 may be set to 16V, and the third high-potential voltage GVDD3 may be set to 14V. The first low-potential voltage GVSS1 may be set to −6V, the second low-potential voltage GVSS2 may be set to −10V, and the third low-potential voltage GVSS3 may be set to −12V. These numerical values are just one example. The levels of the high-potential voltages and the low-potential voltage may vary based on embodiments.

Figure 6:
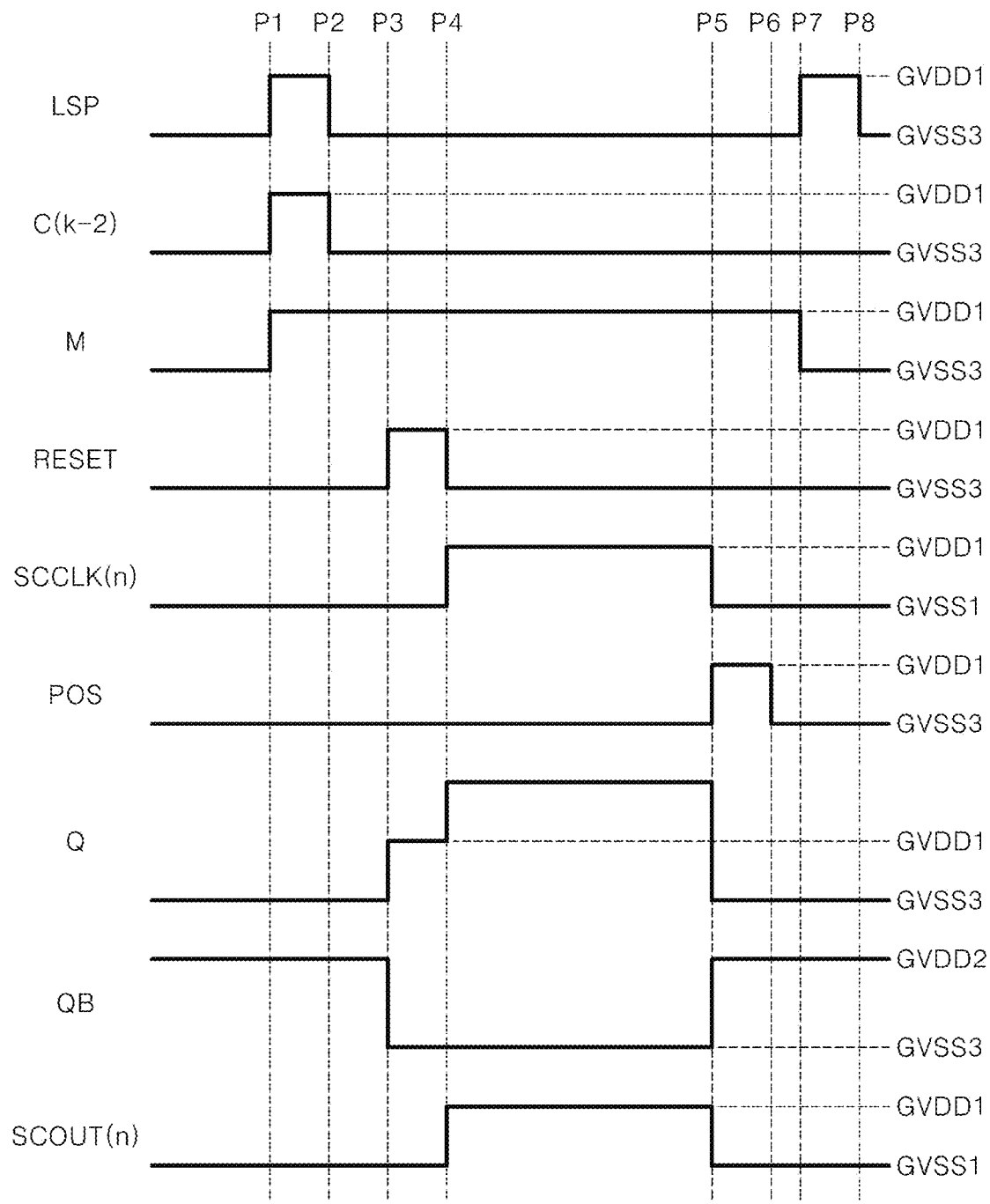
FIG. 6 shows a waveform of each of an input signal and an output signal when the stage circuit of FIG. 5 outputs a gate signal for sensing.

FIG. 6 shows a waveform of each of an input signal and an output signal when the stage circuit of FIG. 5 outputs a gate signal for sensing. In FIG. 6, a period P1 to P3 refers to a image display period, and a period P3 to P8 refers to a blank period.

When a gate line (e.g., an n-th gate line) via which a sensing operation is to be performed is selected by the timing controller 11, a high voltage level line sensing preparation signal LSP is input to a stage circuit corresponding to the selected gate line. When a high voltage level front carry signal C(k−2) together with a high voltage level line sensing preparation signal LSP are input to the stage circuit for a period P1 to P2, the first transistor T11 and the second transistor T12 included in the line selector 502 are turned on such that the M node is charged to a voltage level of the front carry signal C(k−2).

When a low level line sensing preparation signal LSP is input to the stage circuit for a period P2 to P3, the first transistor T11 and the second transistor T12 are turned off, while the voltage of the M node is maintained at a high voltage level due to a voltage stored in the pre-charging capacitor CA.

When a reset signal RESET is input to the stage circuit for a period P3 to P4, the fourth transistor T14 and the fifth transistor T15 included in the line selector 502 are turned on based on the reset signal RESET and the charged voltage of the M node, such that the Q node is charged to the first high-potential voltage GVDD1 level. Further, when the reset signal RESET is input to the stage circuit for the period P3 to P4, the second transistor T52 and the third transistor T53 included in the QB node stabilizer 510 are turned on based on the reset signal RESET and the charged voltage of the M node, such that the QB node is discharged to the third low-potential voltage GVSS3 level.

When a high voltage level scan clock signal SCCLK(n) is input to the stage circuit for a period P4 to P5, the boosting capacitor CS1 bootstraps the voltage of the Q node to a boosting voltage level higher than the first high-potential voltage GVDD1 level. Accordingly, a gate signal SCOUT(n) for a scan operation of the n-th gate line is output from the stage circuit for the period P4 to P5.

When a panel on signal POS is input to the stage circuit for a period P5 to P6, the sixth transistor T16 and the seventh transistor T17 included in the line selector 502 are turned on, such that the Q node is discharged to the third low-potential voltage GVSS3 level. When the Q node has been discharged to the third low-potential voltage GVSS3 level, the fourth transistor T44 included in the inverter 508 is turned off, and the second high-potential voltage GVDD2 is input to a gate of the first transistor T41, such that the first transistor T41 is turned on. When the first transistor T41 is turned on, the QB node is charged to the second high-potential voltage GVDD2 level.

Subsequently, when a high voltage level line sensing preparation signal LSP is input to the stage circuit for a period P7 to P8, the stage circuit is initialized.

Hereinafter, a configuration and an operation process of a stage circuit according to another embodiment of the present disclosure having a smaller number of transistors than the number of transistors included in the stage circuit shown in FIG. 5 will be described below.

Figure 7:
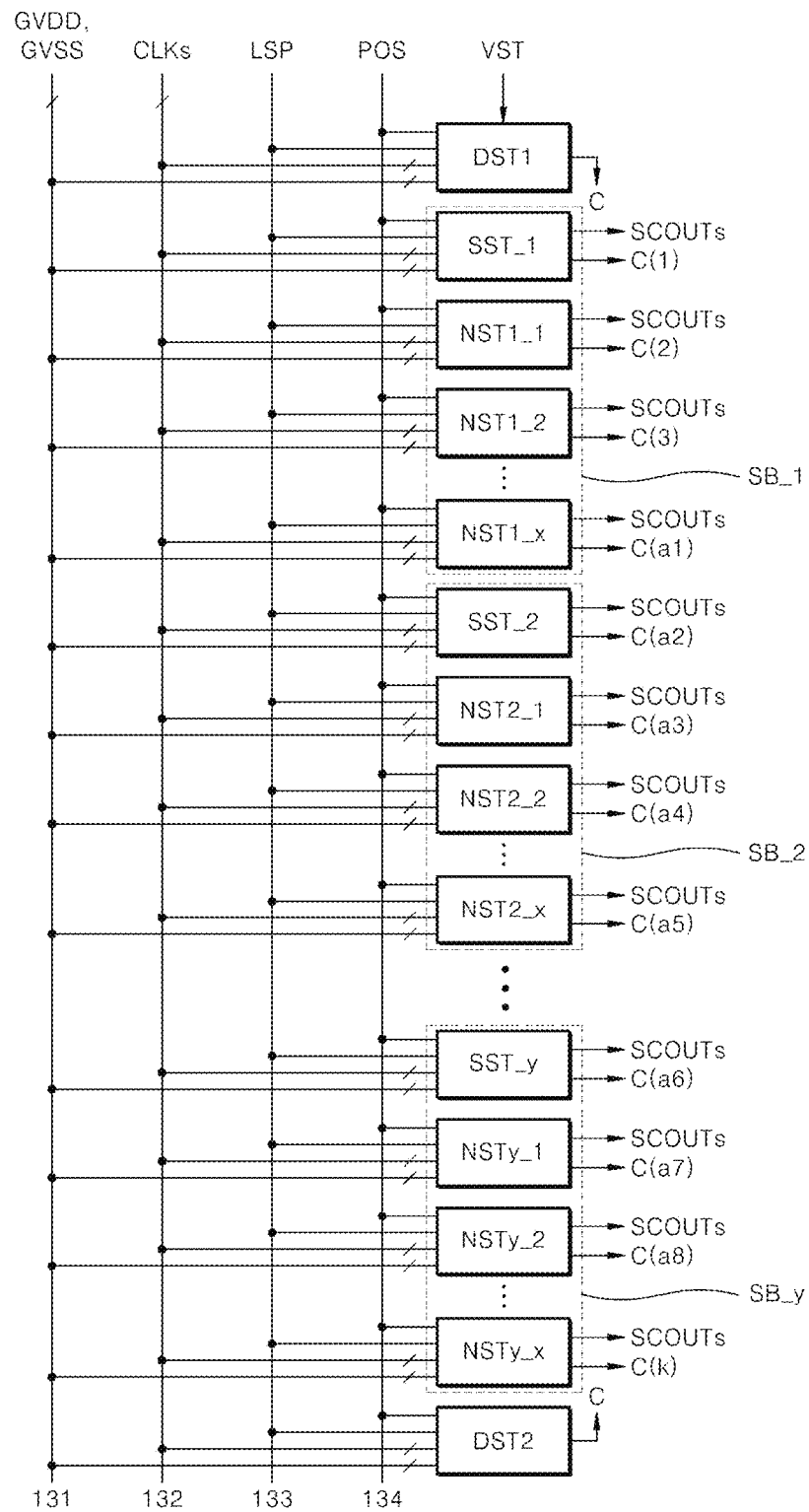
FIG. 7 shows a configuration of a plurality of stage circuits included in a gate driver circuit according to another embodiment of the present disclosure.

FIG. 7 shows a configuration of a plurality of stage circuits included in a gate driver circuit according to another embodiment of the present disclosure.

Referring to FIG. 7, a gate driver circuit according to another embodiment of the present disclosure includes a plurality of stage blocks SB_1 to SB_y (y is a positive integer), a gate driving voltage line 131, a clock signal line 132, a line sensing preparation signal line 133, and a panel on signal line 134. Further, the gate driver circuit may further include a front dummy stage circuit DST1 disposed in front of the stage block SB_1 and a rear dummy stage circuit DST2 disposed in rear of a y-th stage blocks SB_y.

The gate driving voltage line 131 may supply a high-potential voltage GVDD and a low-potential voltage GVSS supplied from the power supply circuit (not shown) to each of stage circuits included in each of the stage blocks SB_1 to SB_y, the front dummy stage circuit DST1, and the rear dummy stage circuit DST2.

In one embodiment of the present disclosure, the gate driving voltage line 131 may include a plurality of high-potential voltage lines for respectively supplying a plurality of high-potential voltages having different voltage levels, and a plurality of low-potential voltage lines for respectively supplying a plurality of low-potential voltages having different voltage levels.

For example, the gate driving voltage line 131 may include two high-potential voltage lines for respectively supplying a first high-potential voltage GVDD1 and a second high-potential voltage GVDD2 having different voltage levels, and four low-potential voltage lines for respectively supplying a first low-potential voltage GVSS1, a second low-potential voltage GVSS2, a third low-potential voltage GVSS3, and a fourth low-potential voltage GVSS4 having different voltage levels. However, this is only one example. The number of the voltage lines included in the gate driving voltage line 131 may vary based on embodiments.

The clock signal line 132 may supply a plurality of clock signals CLK supplied from the timing controller 11, for example, a carry clock signal CRCLK or a scan clock signal SCCLK to each of stage circuits included in each of the stage blocks SB_1 to SB_y, the front dummy stage circuit DST1 and the rear dummy stage circuit DST2.

The line sensing preparation signal line 133 supplies the line sensing preparation signal LSP supplied from the timing controller 11 to each of the stage circuits included in each of the stage blocks SB_1 to SB_y. Optionally, the line sensing preparation signal line 133 may be further connected to the front dummy stage circuit DST1.

The panel on signal line 134 supplies the panel on signal POS supplied from the timing controller 11 to each of the stage circuits included in each of the stage blocks SB_1 to SB_y, the front dummy stage circuit DST1, and the rear dummy stage circuit DST2.

Although not shown, lines for supplying signals other than the lines 131, 132, 133, and 134 shown in FIG. 7 may be additionally connected to each of the stage circuits included in each of the stage blocks SB_1 to SB_y, the front dummy stage circuit DST1, and the rear dummy stage circuit DST2. For example, a line for supplying a gate start signal VST to the front dummy stage circuit DST1 may be additionally connected to the front dummy stage circuit DST1.

In the embodiment of FIG. 7, a reset signal line to which the reset signal RESET is supplied is absent, compared to the embodiment shown in FIG. 4. Therefore, the gate driver circuit shown in FIG. 7 includes the smaller number of the lines than that of the gate driver circuit 13 shown in FIG. 4, so that a size of the former gate driver circuit may be reduced.

The front dummy stage circuit DST1 operates in response to an input of the gate start signal VST supplied from the timing controller 11, and thus outputs the front carry signal C. The front carry signal C may be supplied to one of the stage circuits included in each of the stage blocks SB_1 to SB_y.

The rear dummy stage circuit DST2 outputs the rear carry signal C. The rear carry signal C may be supplied to one of the stage circuits included in each of the stage blocks SB_1 to SB_y.

The stage blocks SB_1 to SB_y respectively include start stage circuits SST_1 to SST_y (y is a positive integer), and normal stage circuits NST1_1 to NSTy_x (each of x and y is a positive integer).

Each stage block includes each start stage circuit and a plurality of normal stage circuits connected with each start stage circuit. For example, a first stage block SB_1 includes a start stage circuit SST1 and a plurality of normal stage circuits NST1_1 to NST1_x. Therefore, the number of the stage blocks and the number of the start stage circuits are equal to each other.

The number of stage blocks or the number of start stage circuits, i.e., y, may vary based on embodiments. Further, the number of normal stage circuits included in each stage block, that is, x may vary based on embodiments.

One start stage circuit and a plurality of normal stage circuits included in each stage block may be connected to each other in a cascaded manner or in a stepwise manner.

In the embodiment shown in FIG. 7, each stage circuit (each start stage circuit or each normal stage circuit) outputs a plurality of gate signals SCOUTs and one carry signal C. For reference, in FIG. 7, each of a1 to a8 is a positive integer smaller than k.

The total number of gate signals output from all of the stage blocks SB_1 to SB_y shown in FIG. 7 is equal to the number n of the gate lines 15 arranged in the display panel 106. For example, when each stage circuit (each of the start stage circuits and the normal stage circuits) outputs four gate signals SCOUTs, and the total number of the start stage circuits (the start stage circuits and the normal stage circuits) included in all of the stage blocks SB_1 to SB_y is k, k=n/4.

However, the number of gate signals output from each stage circuit is not limited thereto. That is, in another embodiment of the present disclosure, each stage circuit may be designed to output one gate signal or three or more gate signals. The number of the stage circuits may vary according to the number of gate signals output from each stage circuit. For example, when each stage circuit outputs one gate signal and the number of gate lines 15 is n, the number k of all stage circuits (the start stage circuits and the normal stage circuits) included in the stage blocks SB_1 to SB_y is equal to n. In a still another example, when each stage circuit outputs two gate signals and the number of gate lines 15 included in the display panel 106 is n, the number of all stage circuits (the start stage circuits and the normal stage circuits) included in the stage blocks SB_1 to SB_y k is n/2.

Hereinafter, an embodiment in which each stage circuit outputs four gate signals SCOUTs and one carry signal C is described. However, the present disclosure is not limited to this embodiment.

Each of the gate signals SCOUTs output from each stage circuit (each start stage circuit or each normal stage circuit) may act as a gate signal for sensing a threshold voltage or a gate signal for displaying an image. Further, each carry signal C output from each stage circuit (each start stage circuit or each normal stage circuit) may be supplied to a stage circuit other than each stage circuit.

Figure 8:
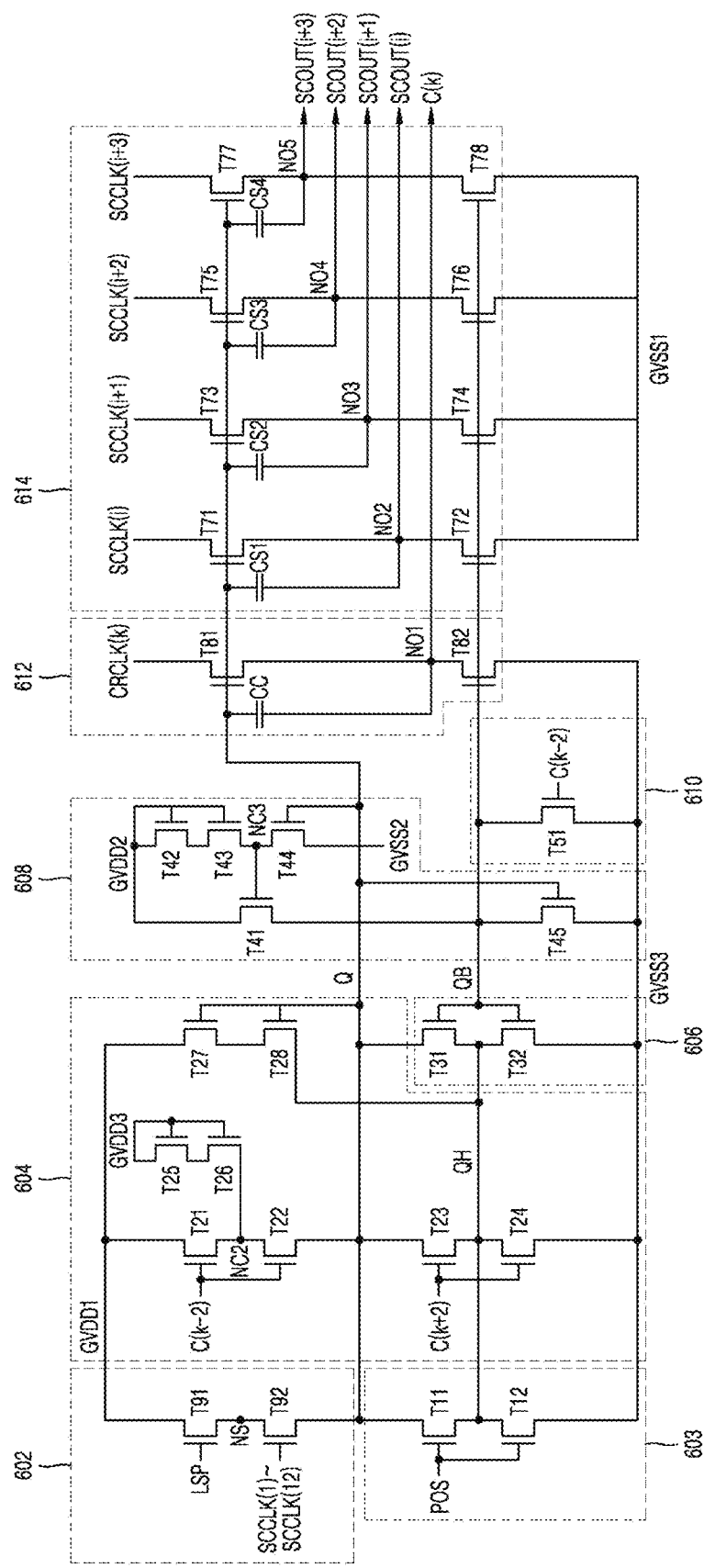
FIG. 8 is a circuit diagram of a start stage circuit according to another embodiment of the present disclosure.
Figure 9:
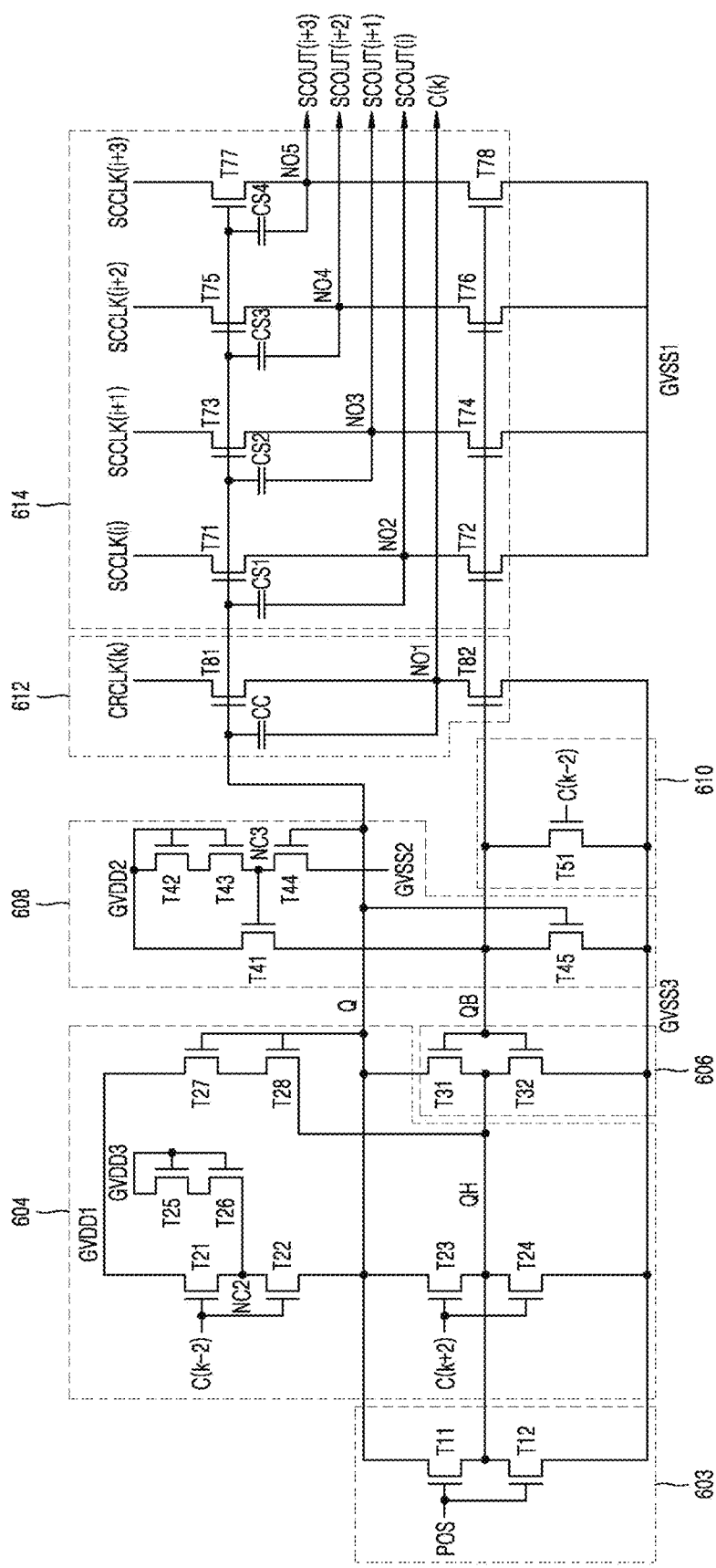
FIG. 9 is a circuit diagram of a normal stage circuit according to another embodiment of the present disclosure.

FIG. 8 is a circuit diagram of a start stage circuit according to another embodiment of the present disclosure, and FIG. 9 is a circuit diagram of a normal stage circuit according to another embodiment of the present disclosure.

The start stage circuit shown in FIG. 8 may be one start stage circuit among the first to y-th stage circuits SST_1 to SST_y shown in FIG. 7. Referring to FIG. 8, each start stage circuit according to another embodiment of the present disclosure includes a Q node, a QH node, and a QB node.

Further, the start stage circuit according to another embodiment of the present disclosure may include a blank start circuit 602 for receiving a block selection signal (a line sensing preparation signal LSP, and one of first to twelfth scan clock signals SCCLK(1) to SCCLK(12)), and a signal output circuit 603 to 614 that outputs a carry signal and a gate signal.

In the embodiment of FIG. 8, the blank start circuit 602 includes a first transistor T91 and a second transistor T92.

The first transistor T91 and the second transistor T92 are disposed between and connected to the Q node and the first high-potential voltage line for delivering the first high-potential voltage GVDD1. Further, the first transistor T91 and the second transistor T92 are connected in series with each other.

The first transistor T91 operates in response to an input of the line sensing preparation signal LSP, and thus electrically connects the first high-potential voltage line to a connection node NS. For example, when the line sensing preparation signal LSP having a high level voltage is input to the first transistor T91, the first transistor T91 is turned on such that the connection node NS is charged to the first high-potential voltage GVDD1 level.

The second transistor T92 operates in response to an input of one of the first to twelfth scan clock signals SCCLK(1) to SCCLK(12) to electrically connect the connection node NS to the Q node. For example, when one of the first to twelfth scan clock signals SCCLK(1) to SCCLK(12) having a high level voltage is input to the second transistor T92, the second transistor T92 is turned on such that the Q node is charged with the voltage charged in the connection node NS.

In another embodiment of the present disclosure, one of the first to twelfth scan clock signals SCCLK(1) to SCCLK(12) may be input to the first transistor T91, and the line sensing preparation signal LSP may be input to the second transistor T92.

Referring back to FIG. 8, the signal output circuit 603 to 614 may include an initializer 603, a Q node controller 604, a Q node and QH node stabilizer 606, an inverter 608, a QB node stabilizer 610, a carry signal output module 612, and a gate signal output module 614.

A circuit configuration and a function of each of the initializer 603, the Q node controller 604, the Q node and QH node stabilizer 606, the inverter 608, the carry signal output module 612, and the gate signal output module 614 as shown in FIG. 8 are respectively identical with a circuit configuration and a function of each of the initializer 503, the Q node controller 504, the Q node and QH node stabilizer 506, the inverter 508, the carry signal output module 512, and the gate signal output module 514 as shown in FIG. 5.

However, the QB node stabilizer 510 shown in FIG. 5 includes the three transistors T51, T52, and T53, whereas the QB node stabilizer 610 shown in FIG. 8 includes only one transistor T51. Further, the first transistor T51 shown in FIG. 8 has substantially the same configuration and function as those of the first transistor T51 shown in FIG. 5.

The normal stage circuit shown in FIG. 9 may be one normal stage circuit among the normal stage circuits NST1_1 to NSTy_x shown in FIG. 7. Referring to FIG. 9, the normal stage circuit according to another embodiment of the present disclosure includes a Q node, a QH node, and a QB node.

Further, the normal stage circuit according to another embodiment of the present disclosure includes a signal output circuit 603 to 614 for outputting a carry signal and a gate signal. The signal output circuit 603 to 614 includes an initializer 603, a Q node controller 604, a Q node and QH node stabilizer 606, an inverter 608, a QB node stabilizer 610, a carry signal output module 612, and a gate signal output module 614.

The signal output circuit 603 to 614 shown in FIG. 9 has the same configuration and function as those of the signal output circuit 603 to 614 shown in FIG. 8. That is, in another embodiment of the present disclosure, the normal stage circuit may refer to a start stage circuit free of the blank start circuit 602.

In the embodiment of FIG. 8, one line sensing preparation signal LSP and the 12 scan clock signals SCCLK(1) to SCCLK(12) are used as the block selection signal input to the blank start circuit 602. In this embodiment, the number y of the stage blocks may be 12. One line sensing preparation signal LSP, and one scan clock signal among the 12 scan clock signals SCCLK(1) to SCCLK(12) may act as the block selection signal and may be input to each stage block.

That is, in the embodiment of FIG. 8, the stage blocks may be distinguished from each other based on an identification number (e.g., one of 1 to 12) of a scan clock signal input to the second transistor T92. For example, when the gate driver circuit in FIG. 7 includes a total of 540 stage circuits (the start stage circuits and the normal stage circuits), the 540 stage circuits may be divided into the 12 stage blocks based on the scan clock signal numbers (e.g., 1 to 12). Each stage block includes 45 stage circuits (one start stage circuit and 44 normal stage circuits). The 12 scan clock signals having different signal identification numbers may be respectively assigned to the 12 start stage circuits respectively included in the 12 stage blocks.

However, when the number of the scan clock signals varies, the number y of the stage blocks may vary.

In one embodiment of the present disclosure, the block selection signal is input to the blank start circuit of the start stage circuit connected to a normal stage circuit that supplies a gate signal for sensing a threshold voltage of a sub-pixel to a gate line selected as a sensing line.

Therefore, when the block selection signal is input to the start stage circuit, the gate signal for sensing the threshold voltage of the sub-pixel is output from the normal stage circuit corresponding to the gate line selected as the sensing line among the plurality of normal stage circuits connected to the start stage circuit.

For example, when an eighth gate line is selected as the sensing line in the embodiment of FIG. 7, the block selection signal is input to a blank start circuit of the start stage circuit SST_1 connected to the normal stage circuit NST1_1 that supplies the gate signal SCOUT(8) to the eighth gate line selected as the sensing line.

That is, the block selection signal (e.g., the line sensing preparation signal LSP and an eleventh scan clock signal SCCLK(11)) assigned to the start stage circuit SST_1 is input to the blank start circuit of the start stage circuit SST_1. Accordingly, the gate signal for sensing the threshold voltage of the sub-pixel is output from the normal stage circuit NST1_1 corresponding to the eighth gate line selected as the sensing line among the plurality of normal stage circuits NST1_1 to NST1_x connected to the start stage circuit SST_1.

Figure 10:
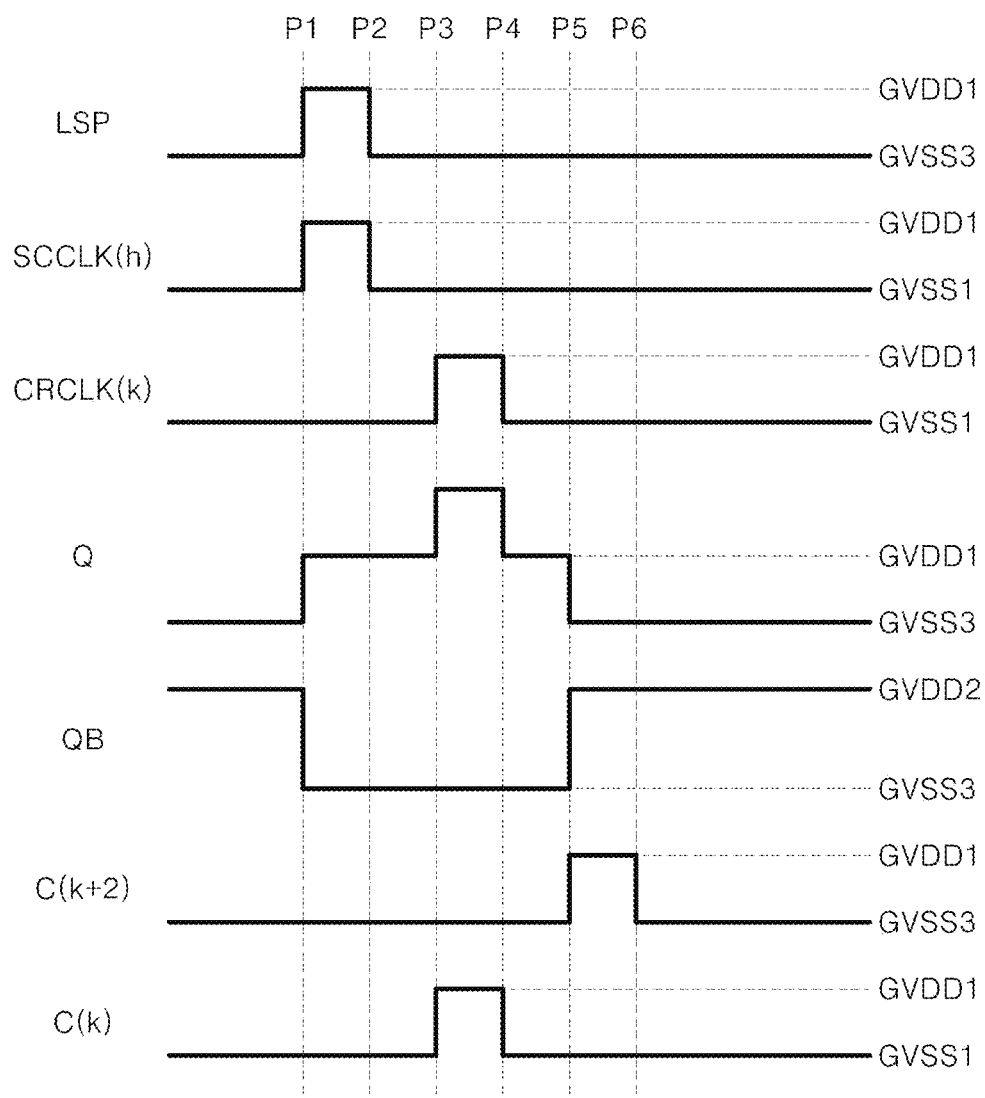
FIG. 10 shows a waveform of each of an input signal and an output signal of a start stage circuit when a gate driver circuit according to another embodiment of the present disclosure outputs a gate signal for sensing.
Figure 11:
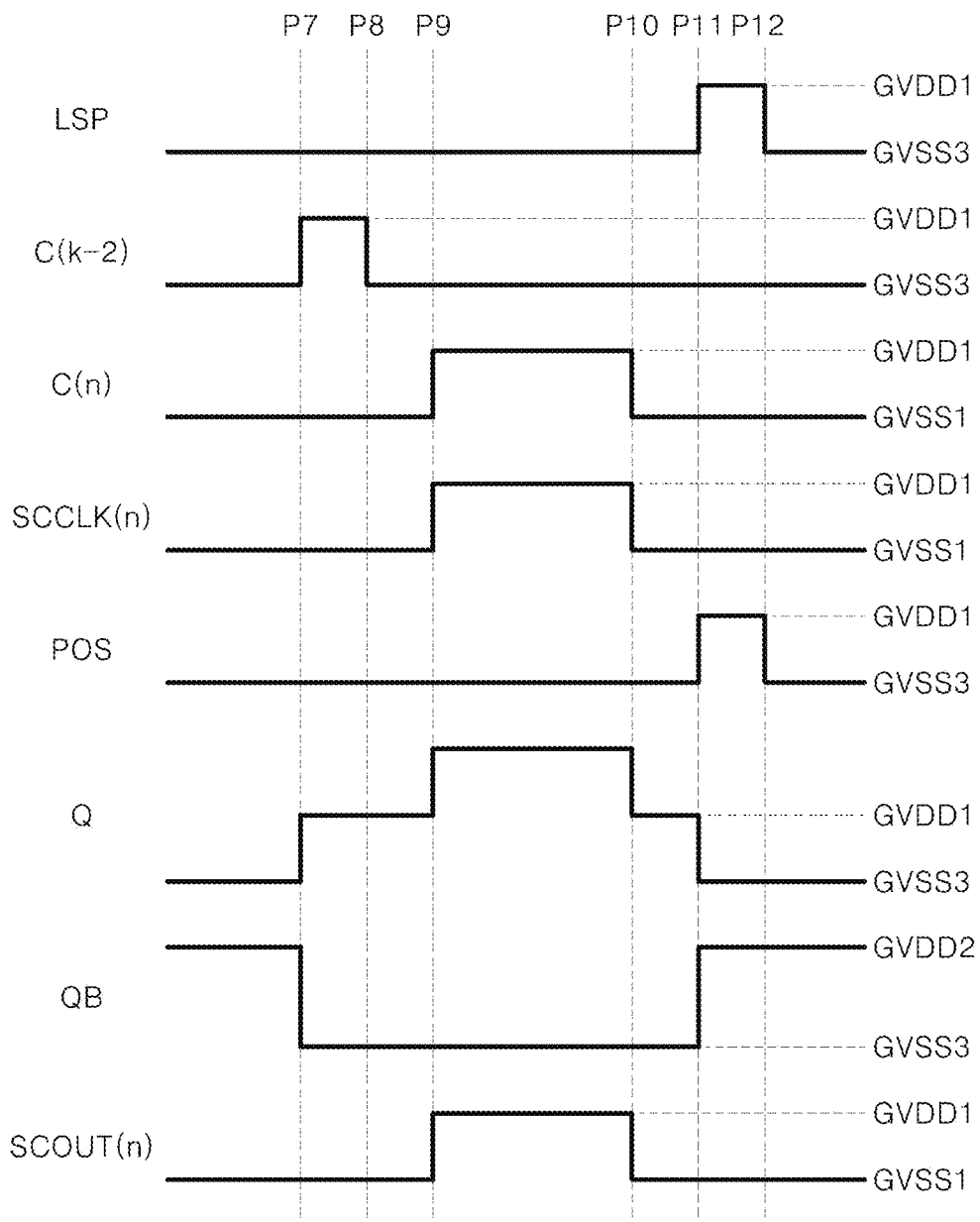
FIG. 11 shows a waveforms of each of an input signal and an output signal of each of a start stage circuit and a normal stage circuit when a gate driver circuit according to another embodiment of the present disclosure outputs a gate signal for sensing.

FIG. 10 shows a waveform of each of an input signal and an output signal of a start stage circuit when a gate driver circuit according to another embodiment of the present disclosure outputs a gate signal for sensing. FIG. 11 shows a waveforms of each of an input signal and an output signal of each of a start stage circuit and a normal stage circuit when a gate driver circuit according to another embodiment of the present disclosure outputs a gate signal for sensing. In FIG. 10 and FIG. 11, a period P1 to P12 refers to a blank period.

First, referring to FIG. 10, when a gate line (e.g., an n-th gate line) via which a sensing operation is to be performed is selected by the timing controller 11, a block selection signal, that is, a line sensing preparation signal LSP and a scan clock signal SCCLK(h) (h being a positive integer) are input to the blank start circuit 602 of the start stage circuit connected to the normal stage circuit corresponding to the selected gate line. When a high voltage level line sensing preparation signal LSP and the high voltage level line scan clock signal SCCLK(h) are input to the blank start circuit 602 of the start stage circuit for a period P1 to P2, the first transistor T91 and the second transistor T92 included in the blank start circuit 602 are turned on such that the Q node is charged to the first high-potential voltage GVDD1 level.

When a carry clock signal CRCLK(k) is input to the carry signal output module 612 of the start stage circuit for a period P3 to P4 while the Q node has been charged to the first high-potential voltage GVDD1 level, the Q node is boosted to a boosting voltage level higher than the first high-potential voltage GVDD1 level. Accordingly, a carry signal C(k) having a high level voltage is output through the first output node NO1. When the carry signal C(k) is output from the start stage circuit, the carry signal is sequentially input to the normal stage circuits that are connected to the start stage circuit in a cascaded manner.

When the carry clock signal CRCLK(k) is brought into a low voltage level state for a period P4 to P5, the Q node is charged to the first high-potential voltage GVDD1 level.

When a rear carry signal C(k+2) is input to the Q node controller 604 of the start stage circuit for a period P5 to P6, the Q node is discharged to the third low-potential voltage GVSS3 level.

Then, referring to FIG. 11, for a period P7 to P8, a high voltage level front carry signal C(k−2) is input to the Q node controller 604 of the normal stage circuit corresponding to the gate line (e.g., an n-th gate line) selected as a gate line via which a sensing operation is to be performed by the timing controller 11. Accordingly, the Q node is charged to the first high-potential voltage GVDD1 level.

For a period P9 to P10, a scan clock signal SCCLK(n) is input to the gate signal output module 614 of the normal stage circuit. Further, for the period P9 to P10, a carry signal C(n) together with a scan clock signal SCCLK(n) are output. In response to the output of the carry signal C(n), the Q node is boosted to a voltage level higher than the first high-potential voltage GVDD1 level. A gate signal SCOUT(n) for sensing a threshold voltage is output from an output node corresponding to the gate line (e.g., an n-th gate line) selected as a gate line via which a sensing operation is to be performed by the timing controller 11.

For a period P10 to P11, each of the carry signal C(n) and the scan clock signal SCCLK(n) is brought into a low voltage level state such that the Q node is charged to the first high-potential voltage GVDD1 level.

For a period P11 to P12, the line sensing preparation signal LSP is input to the blank start circuit 602 of the start stage circuit, and the panel on signal POS is input to the initializer 603 of each of the start stage circuit and the normal stage circuit. Accordingly, the Q node is discharged to the third low-potential voltage GVSS3 level.

As shown in FIG. 6, in the gate driver circuit 13 including the stage circuit shown in FIG. 5, the M node of the stage circuit corresponding to the gate line to which the gate signal for sensing the threshold voltage is to be output is precharged for the image display period P1 to P3. Then, for the blank period P3 to P4, the gate signal for sensing the threshold voltage is output in response to an input of the reset signal RESET and an input of the scan clock signal SCCLK(n).

However, as shown in FIG. 10 and FIG. 11, in the gate driver circuit including the stage circuit shown in FIG. 8 and FIG. 9, for the blank period P1 to P6, the block selection signal is input to the start stage circuit connected to the normal stage circuit corresponding to the gate line to which the gate signal for sensing the threshold voltage is to be output. Then, the gate signal for sensing the threshold voltage is output when the front carry signal C(k−2) and the scan clock signal SCCLK(n) is input to the normal stage circuit corresponding to the gate line to which the gate signal for sensing the threshold voltage is to be output.

That is, in the gate driver circuit including the stage circuit shown in FIG. 8 and FIG. 9, there is no need to pre-charge a voltage to a specific node for the image display period. The block selection signal is input to the start stage circuit for the blank period, and then, the front carry signal C(k−2) and the scan clock signal SCCLK(n) are input to the normal stage circuit, such that the gate signal is output. Therefore, the gate driver circuit including the stage circuit shown in FIG. 8 and FIG. 9 may output the gate signal more rapidly than the gate driver circuit 13 including the stage circuit shown in FIG. 5 may.

Figure 12:
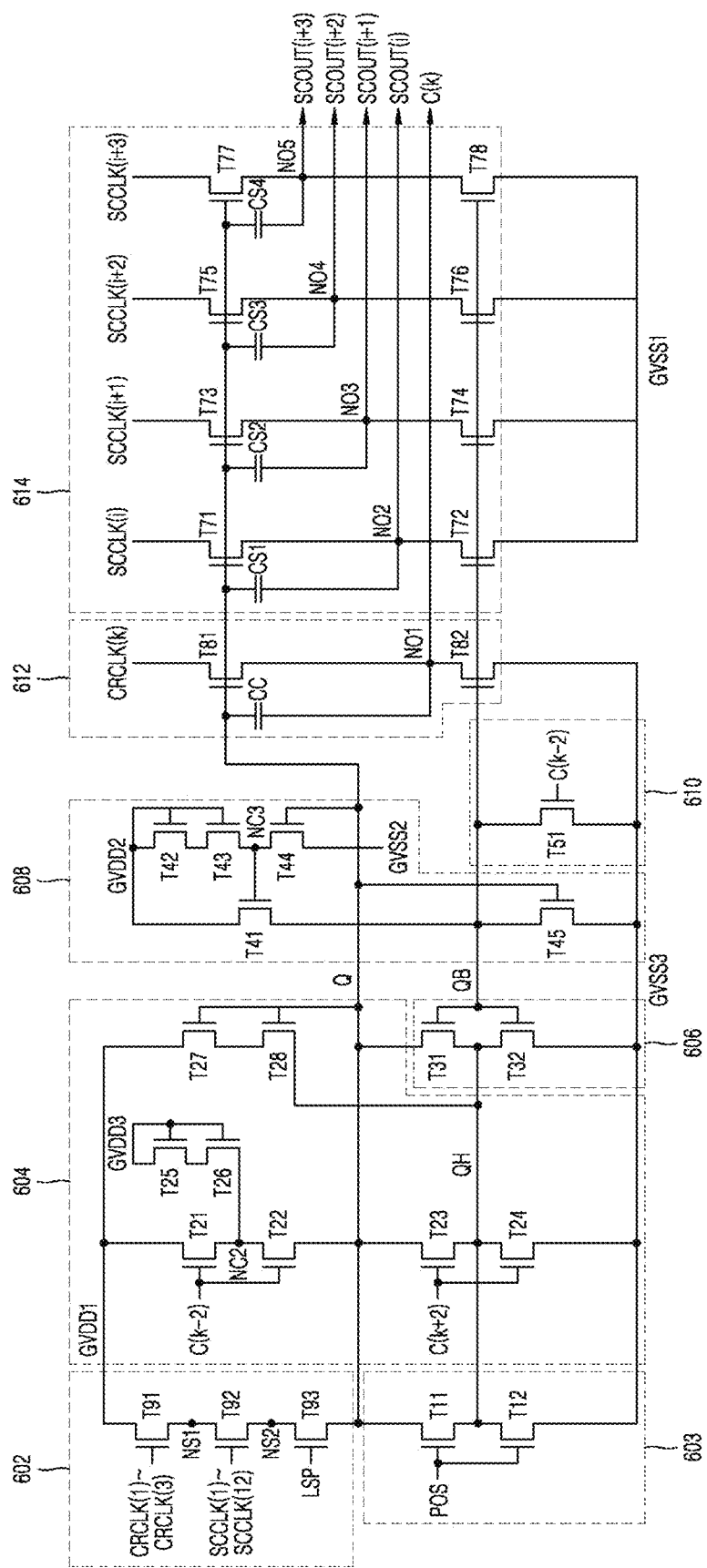
FIG. 12 is a circuit diagram of a start stage circuit according to still another embodiment of the present disclosure.

FIG. 12 is a circuit diagram of a start stage circuit according to still another embodiment of the present disclosure.

In still another embodiment of the present disclosure, the gate driver circuit includes a start stage circuit shown in FIG. 12 and a normal stage circuit shown in FIG. 9.

Referring to FIG. 12, the start stage circuit according to still another embodiment of the present disclosure includes a blank start circuit 602 for receiving the block selection signal (a line sensing preparation signal LSP, one of first to third carry clock signals CRCLK(1) to CRCLK(3), and one of first to twelfth scan clock signals SCCLK(1) to SCCLK (12)) and a signal output circuit 603 to 614 for outputting a carry signal and a gate signal.

In the embodiment of FIG. 12, the blank start circuit 602 includes a first transistor T91, a second transistor T92, and a third transistor T93.

The first transistor T91, the second transistor T92, and the third transistor T93 are disposed between and connected to the Q node and the first high-potential voltage line for delivering the first high-potential voltage GVDD1. Further, the first transistor T91, the second transistor T92, and the third transistor T93 are connected in series with each other.

The first transistor T91 operates in response to an input of one of the first to third carry clock signals CRCLK(1) to CRCLK(3) to electrically connect the first high-potential voltage line to a first connection node NS1. For example, when one of the first to third carry clock signals CRCLK(1) to CRCLK(3) having a high level voltage is input to the first transistor T91, the first transistor T91 is turned on such that the first connection node NS1 is charged to the first high-potential voltage GVDD1 level.

The second transistor T92 operates in response to an input of one of the first to twelfth scan clock signals SCCLK(1) to SCCLK(12), and thus electrically connects the first connection node NS1 to a second connection node NS2. For example, when one of the first to twelfth scan clock signals SCCLK(1) to SCCLK(12) having a high level voltage is input to the second transistor T92, the second transistor T92 is turned on such that the first connection node NS1 and the second connection node NS2 are electrically connected to each other.

The third transistor T93 operates in response to an input of the line sensing preparation signal LSP, and thus electrically connects the second connection node NS2 to the Q node. For example, when the line sensing preparation signal LSP having a high level voltage is input to the third transistor T93, the third transistor T93 is turned on such that the Q node is charged with a voltage charged in the second connection node NS2.

In still another embodiment of the present disclosure, each of types of the block selection signals respectively input to the first transistor T91, the second transistor T92, and the third transistor T93 may vary. For example, one of the first to twelfth scan clock signals SCCLK(1) to SCCLK (12) or the line sensing preparation signal LSP may be input to the first transistor T91. One of the first to third carry clock signals CRCLK(1) to CRCLK(3) or the line sensing preparation signal LSP may be input to the second transistor T92. Further, one of the first to third carry clock signals CRCLK (1) to CRCLK(3) or one of the first to twelfth scan clock signals SCCLK(1) to SCCLK(12) may be input to the third transistor T93.

Referring back to FIG. 12, the signal output circuit 603 to 614 may include an initializer 603, a Q node controller 604, a Q node and QH node stabilizer 606, an inverter 608, a QB node stabilizer 610, a carry signal output module 612, and a gate signal output module 614.

Each of the initializer 603, the Q node controller 604, the Q node and QH node stabilizer 606, the inverter 608, the QB node stabilizer 610, the carry signal output module 612, and the gate signal output module 614 of the signal output circuit 603 to 614 as shown in FIG. 12 may have the same configuration and function as those of each of the initializer 603, the Q node controller 604, the Q node and QH node stabilizer 606, the inverter 608, the QB node stabilizer 610, the carry signal output module 612, and the gate signal output module 614 of the signal output circuit 603 to 614 as shown in FIG. 8.

In the embodiment of FIG. 12, the three carry clock signals CRCLK(1) to CRCLK(3), the twelve scan clock signals SCCLK(1) to SCCLK(12) and the single line sensing preparation signal LSP may be used as the block selection signal input to the blank start circuit 602. In this embodiment, the number y of the stage blocks may be 36, and one line sensing preparation signal LSP, one of the three carry clock signals CRCLK(1) to CRCLK(3) and one of the twelve scan clock signals SCCLK(1) to SCCLK(12) may be input, as the block selection signals, to each stage block.

That is, in the embodiment of FIG. 12, the stage blocks may be distinguished from each other based on an identification number (e.g., 1 to 3) of a carry clock signal input to the first transistor T91, and an identification number (e.g., 1 to 12) of a scan clock signal input to the second transistor T92. For example, when the gate driver circuit in FIG. 8 includes a total of 540 stage circuits (start stage circuits and normal stage circuits), the 540 stage circuits may be divided into the 24 stage blocks based on combinations of identification numbers (e.g., 1 to 3) of the carry clock signal and identification numbers (e.g., 1 to 12) of the scan clock signal. Each stage block has 23 stage circuits (start stage circuit and normal stage circuits). The combinations of the carry clock signals having different identification numbers and the scan clock signals having different identification numbers may be respectively allocated to the 24 start stage circuits.

However, the number of the carry clock signals and the number of the scan clock signals may vary. Thus, the number y of the stage blocks may vary.

Figure 13:
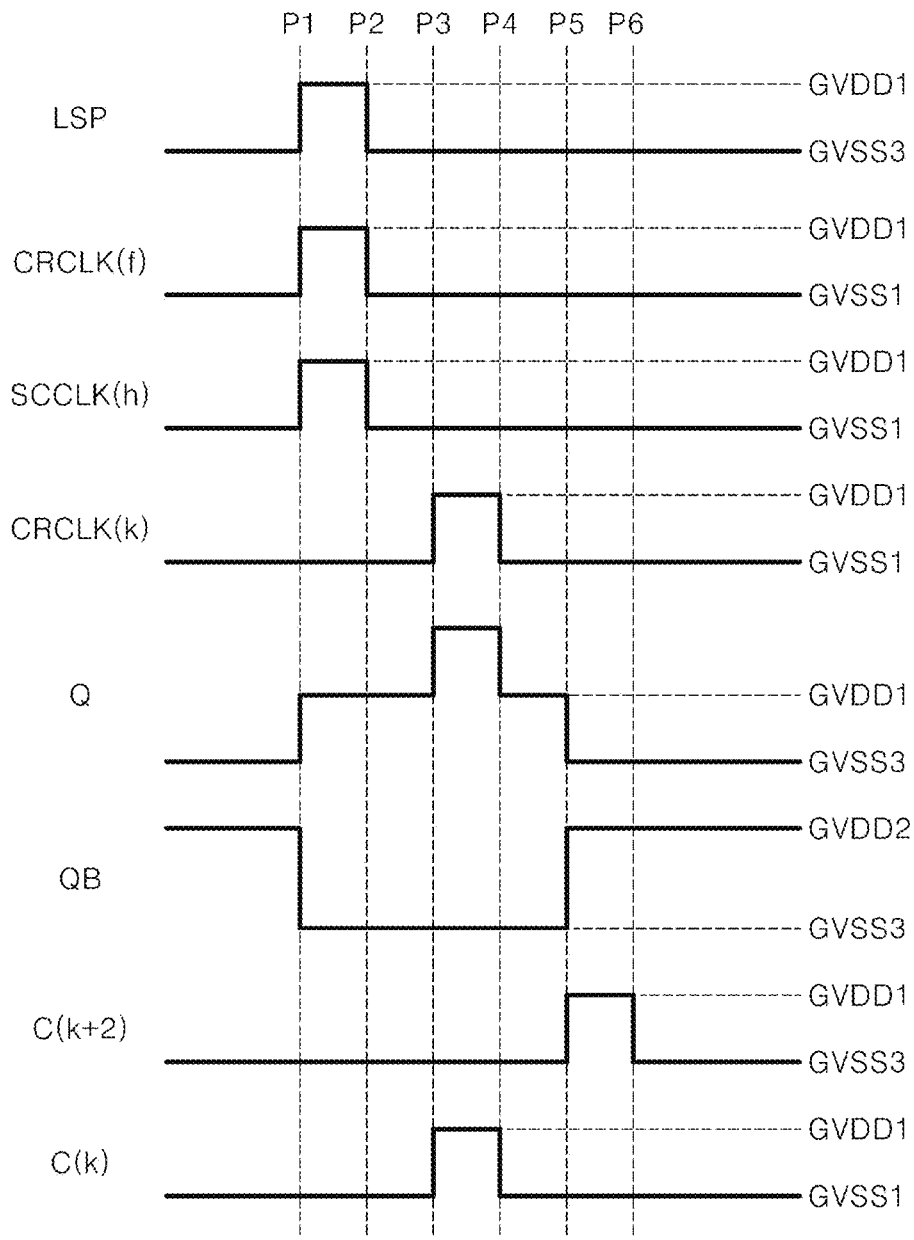
FIG. 13 shows a waveform of each of an input signal and an output signal of the start stage circuit shown in FIG. 12 when a gate driver circuit according to still another embodiment of the present disclosure outputs a gate signal for sensing.

FIG. 13 shows a waveform of each of an input signal and an output signal of the start stage circuit shown in FIG. 12 when the gate driver circuit according to still another embodiment of the present disclosure outputs a gate signal for sensing.

Referring to FIG. 13, when the gate line (e.g., an n-th gate line) via which a sensing operation is to be performed is selected by the timing controller 11, the block selection signal, that is, a carry clock signal CRCLK(f) (f being an positive integer), a scan clock signals SCCLK(h) (h being a positive integer), and a line sensing preparation signal LSP are input to the blank start circuit 602 of the start stage circuit connected to the normal stage circuit corresponding to the selected gate line. When a high voltage level carry clock signal CRCLK(f), a high voltage level scan clock signal SCCLK(h), and a high voltage level line sensing preparation signal LSP are input to the blank start circuit 602 of the start stage circuit for a period P1 to P2, the first transistor T91 and the second transistor T92 included in the blank start circuit 602 are turned on such that the Q node is charged to the first high-potential voltage GVDD1 level.

When the carry clock signal CRCLK(k) is input to the carry signal output module 612 of the start stage circuit for a period P3 to P4 while the Q node has been charged to the first high-potential voltage GVDD1 level, the Q node is boosted to a voltage level higher than the first high-potential voltage GVDD1 level. Accordingly, a carry signal C(k) having a high level voltage is output through the first output node NO1. When the carry signal C(k) is output from the start stage circuit, the carry signal is sequentially input to the normal stage circuits that are connected to the start stage circuit in a cascaded manner.

When the carry clock signal CRCLK(k) is brought into a low voltage level state for a period P4 to P5, the Q node is charged to the first high-potential voltage GVDD1 level.

For a period P5 to P6, a rear carry signal C(k+2) is input to the Q node controller 604 of the start stage circuit, such that the Q node is discharged to the third low-potential voltage GVSS3 level.

Then, as shown in FIG. 11, a gate signal SCOUT(i) for sensing a threshold voltage is output from a normal stage circuit corresponding to the gate line selected by the timing controller 11 via input/output of signals for a period P7 to P12.

Figure 14:
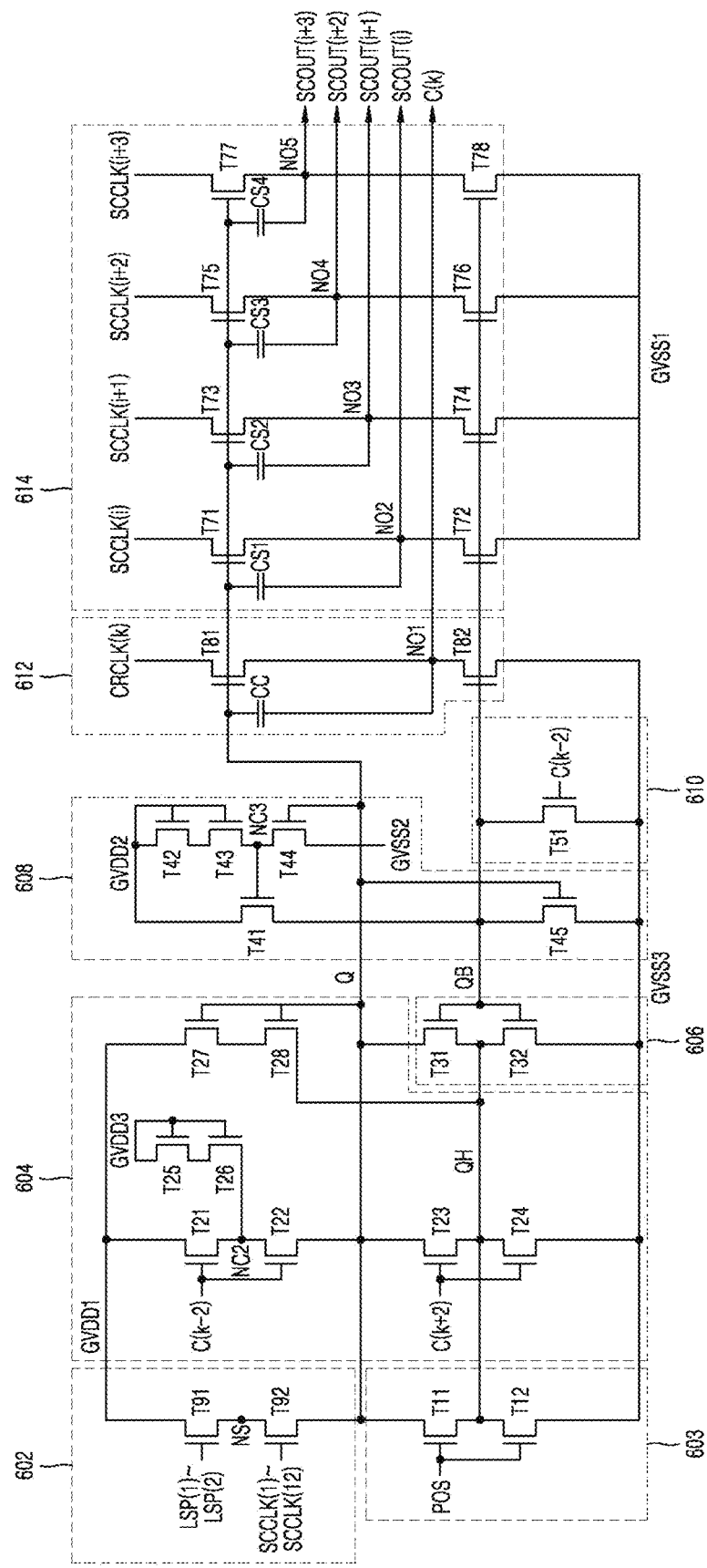
FIG. 14 is a circuit diagram of a start stage circuit according to still yet another embodiment of the present disclosure.

FIG. 14 is a circuit diagram of a start stage circuit according to still yet another embodiment of the present disclosure.

In still yet another embodiment of the present disclosure, the gate driver circuit includes the start stage circuit shown in FIG. 14 and the normal stage circuit shown in FIG. 9.

Referring to FIG. 14, the start stage circuit according to still yet another embodiment of the present disclosure includes a blank start circuit 602 that receives a block selection signal (one of first to third line sensing preparation signals LSP 1 to LSP 3, and one of first to twelfth scan clock signals SCCLK(1) to SCCLK(12)), and a signal output circuit 603 to 614 that outputs a carry signal and a gate signal.

In the embodiment of FIG. 14, the blank start circuit 602 includes a first transistor T91 and a second transistor T92.

The first transistor T91 and the second transistor T92 are disposed between and connected to the Q node and the first high-potential voltage line for delivering the first high-potential voltage GVDD1. Further, the first transistor T91 and the second transistor T92 are connected in series with each other.

The first transistor T91 operates in response to an input of one of the first to third line sensing preparation signals LSP 1 to LSP 3, and thus electrically connects the first high-potential voltage line to a connection node NS. For example, when a first line sensing preparation signal LSP 1 having a high level voltage is input to the first transistor T91, the first transistor T91 is turned on such that the connection node NS is charged to the first high-potential voltage GVDD1 level.

The second transistor T92 operates in response to an input of one of the first to twelfth scan clock signals SCCLK(1) to SCCLK(12) to electrically connect the connection node NS to the Q node. For example, when one of the first to twelfth scan clock signals SCCLK(1) to SCCLK(12) having a high level voltage is input to the second transistor T92, the second transistor T92 is turned on such that the Q node is charged with a voltage charged in the connection node NS.

In another embodiment of the present disclosure, one of the first to twelfth scan clock signals SCCLK(1) to SCCLK(12) may be input to the first transistor T91, and one of the first to third line sensing preparation signals LSP 1 to LSP 3 may be input to the second transistor T92.

Referring back to FIG. 14, the signal output circuit 603 to 614 may include a initializer 603, a Q node controller 604, a Q node and QH node stabilizer 606, an inverter 608, a QB node stabilizer 610, a carry signal output module 612, and a gate signal output module 614.

Each of the initializer 603, the Q node controller 604, the Q node and QH node stabilizer 606, the inverter 608, the QB node stabilizer 610, the carry signal output module 612, and the gate signal output module 614 of the signal output circuit 603 to 614 as shown in FIG. 14 may have the same configuration and function as those of each of the initializer 603, the Q node controller 604, the Q node and QH node stabilizer 606, the inverter 608, the QB node stabilizer 610, the carry signal output module 612, and the gate signal output module 614 of the signal output circuit 603 to 614 as shown in FIG. 8.

In the embodiment of FIG. 14, the three line sensing preparation signals LSP 1 to LSP 3 and the 12 scan clock signals SCCLK(1) to SCCLK(12) may be used as the block selection signals input to the blank start circuit 602. In this embodiment, the number y of the stage blocks may be 36. Thus, one of the three line sensing preparation signals LSP 1 to LSP 3 and one of the 12 scan clock signals SCCLK(1) to SCCLK(12) may be input, as the block selection signals, to each stage block.

That is, in the embodiment of FIG. 14, the stage blocks may be distinguished from each other based on an identification number (e.g., 1 to 3) of the line sensing preparation signal input to the first transistor T91, and an identification number (e.g., 1 to 12) of the scan clock signal input to the second transistor T92. For example, when the gate driver circuit in FIG. 14 includes a total of 540 stage circuits (start stage circuits and normal stage circuits), the 540 stage circuits may be divided into the 24 stage blocks based on combinations of identification numbers (e.g., 1 to 3) of the line sensing preparation signal and identification numbers (e.g., 1 to 12) of the scan clock signal. Each stage block has 23 stage circuits (start stage circuit and normal stage circuits). The combinations of the carry clock signals having different identification numbers and the scan clock signals having different identification numbers may be respectively allocated to the 24 start stage circuits.

However, the number of the line sensing preparation signals and the number of the scan clock signals may vary. Thus, the number y of the stage blocks may vary.

Figure 15:
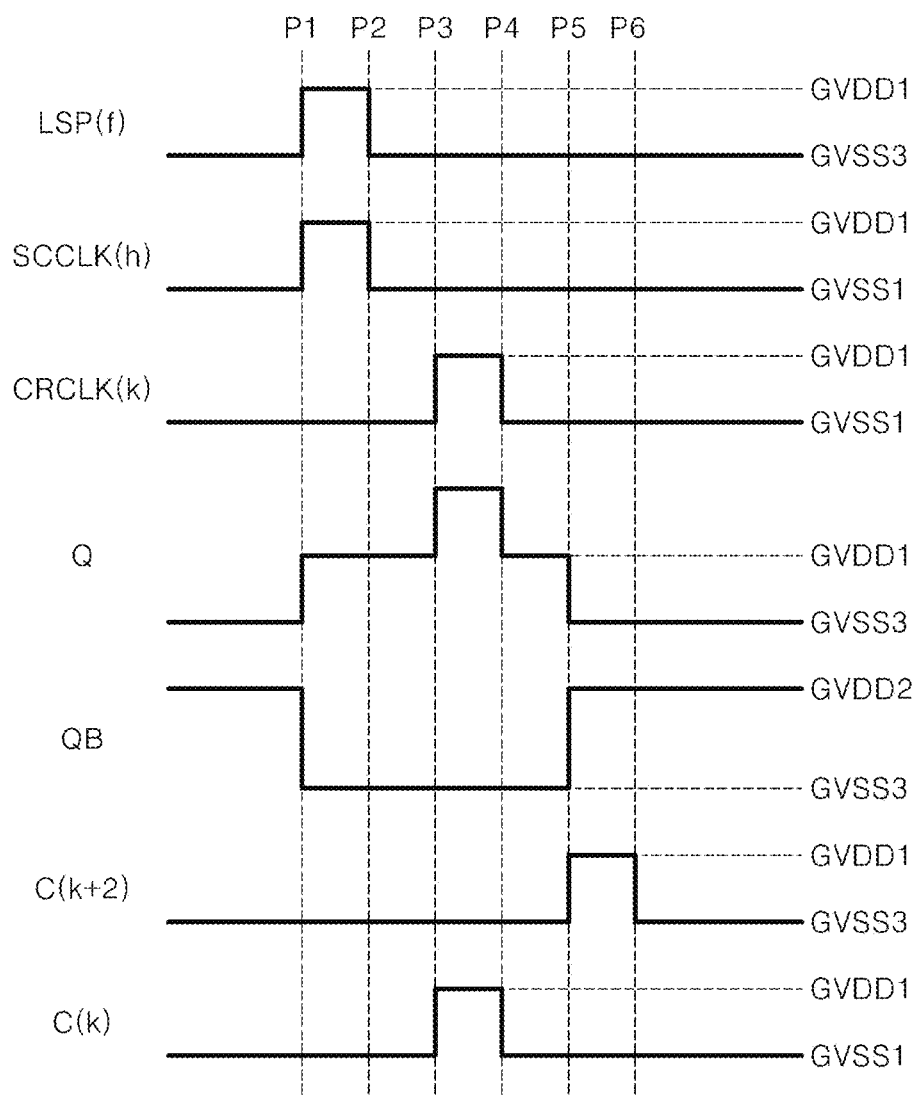
FIG. 15 shows a waveform of each of an input signal and an output signal of the start stage circuit shown in FIG. 14 when a gate driver circuit according to still yet another embodiment of the present disclosure outputs a gate signal for sensing.

FIG. 15 shows a waveform of each of an input signal and an output signal of the start stage circuit shown in FIG. 14 when the gate driver circuit according to still another embodiment of the present disclosure outputs a gate signal for sensing.

Referring to FIG. 15, when a gate line (e.g., an n-th gate line) via which a sensing operation is to be performed is selected by the timing controller 11, the block selection signals, that is, a line sensing preparation signal LSP(f) (f is a positive integer), and a scan clock signal SCCLK(h) (h is a positive integer) may be input to the blank start circuit 602 of the start stage circuit connected to the normal stage circuit corresponding to the selected gate line.

For a period P1 to P2, a high voltage level carry clock signal CRCLK(f), a high voltage level scan clock signal SCCLK(h), and a high voltage level line sensing preparation signal LSP are input to the blank start circuit 602 of the start stage circuit. Thus, the first transistor T91 and the second transistor T92 included in the blank start circuit 602 are turned on such that the Q node is charged to the first high-potential voltage GVDD1 level.

The carry clock signal CRCLK(k) is input to the carry signal output module 612 of the start stage circuit for a period P3 to P4 while the Q node has been charged to the first high-potential voltage GVDD1 level. Thus, the Q node is boosted to a voltage level higher than the first high-potential voltage GVDD1 level. Accordingly, a carry signal C(k) having a high level voltage is output through the first output node NO1.

When the carry signal C(k) is output from the start stage circuit, the carry signal is sequentially input to the normal stage circuits that are connected to the start stage circuit in a cascaded manner.

For a period P4 to P5, the carry clock signal CRCLK(k) is brought into a low voltage level state, such that the Q node is charged to the first high-potential voltage GVDD1 level.

For a period P5 to P6, a rear carry signal C(k+2) is input to the Q node controller 604 of the start stage circuit, such that the Q node is discharged to the third low-potential voltage GVSS3 level.

Then, as shown in FIG. 11, a gate signal SCOUT(i) for sensing a threshold voltage is output from the normal stage circuit corresponding to the gate line selected by the timing controller 11 via input/output of signals for a period P7 to P12.

The stage circuit according to each of the embodiments of the present disclosure described based on FIG. 8 to FIG. 15 includes the smaller number of the transistors and the smaller number of the voltage lines, compared to those of the stage circuit shown in FIG. 5. Therefore, the size of the gate driver circuit including the stage circuit according to each of the embodiments of the present disclosure described based on FIG. 8 to FIG. 15 becomes smaller than the size of the gate driver circuit including the stage circuit shown in FIG. 5.

Further, as described above, in the gate driver circuit including the stage circuit according to each of the embodiments of the present disclosure described based on FIG. 8 to FIG. 15, there is no need to pre-charge a voltage to a specific node for the image display period. The block selection signal is input to the start stage circuit for the blank period, and then, the front carry signal C(k−2) and the scan clock signal SCCLK(n) are input to the normal stage circuit, such that the gate signal is output. Therefore, the gate driver circuit including the stage circuit according to each of the embodiments of the present disclosure described based on FIG. 8 to FIG. 15 may output the gate signal more rapidly than the gate driver circuit 13 including the stage circuit shown in FIG. 5 may.

It will be apparent to those skilled in the art that various modifications and variations can be made in the gate driver circuit and the display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A gate driver circuit for a display device, wherein the gate driver circuit includes a plurality of stage blocks for outputting n gate signals,
    wherein each of the stage blocks includes:
        a single start stage circuit including:
            a blank start circuit for receiving a block selection signal; and
            a signal output circuit for outputting a carry signal and a gate signal; and
        a plurality of normal stage circuits connected to the single start stage circuit.

2. The gate driver circuit of claim 1, wherein each of the plurality of normal stage circuits includes each signal output circuit identical with the signal output circuit of the single start stage circuit.

3. The gate driver circuit of claim 1, further comprising:
    a front dummy stage circuit disposed in front of a first stage block, the front dummy stage circuit being configured to operate in response to an input of a gate start signal and output a front carry signal to one of the stage blocks; and
    a rear dummy stage circuit disposed in rear of a last stage blocks, the rear dummy stage circuit being configured to output a rear carry signal to one of the stage blocks.

4. The gate driver circuit of claim 1, wherein the block selection signal is input to a blank start circuit of a start stage circuit connected to a normal stage circuit supplying a gate signal for sensing a threshold voltage of a sub-pixel to a gate line selected as a sensing line.

5. The gate driver circuit of claim 1, wherein when the block selection signal is input to the start stage circuit, a gate signal for sensing a threshold voltage of a sub-pixel is output from a normal stage circuit corresponding to a gate line selected as a sensing line among the plurality of normal stage circuits connected to the start stage circuit.

6. The gate driver circuit of claim 1, wherein the blank start circuit includes:
    a first transistor turned on in response to an input of a line sensing preparation signal; and
    a second transistor connected in series with the first transistor, wherein the second transistor is turned on in response to an input of a scan clock signal.

7. The gate driver circuit of claim 6, wherein the first transistor and the second transistor are disposed between and connected to a Q node and a first high-potential voltage line for delivering a first high-potential voltage.

8. The gate driver circuit of claim 6, wherein each stage block is identified based on at least one of an identification number of the line sensing preparation signal input to the first transistor or an identification number of the scan clock signal input to the second transistor.

9. The gate driver circuit of claim 1, wherein the blank start circuit includes:

a first transistor turned on in response to an input of a line sensing preparation signal; and a second transistor connected in series with the first transistor, wherein the second transistor is turned on in response to an input of a carry clock signal.

10. The gate driver circuit of claim 9, wherein the first transistor and the second transistor are disposed between and connected to a Q node and a first high-potential voltage line for delivering a first high-potential voltage.

11. The gate driver circuit of claim 9, wherein each stage block is identified based on at least one of an identification number of the line sensing preparation signal input to the first transistor or an identification number of the carry clock signal input to the second transistor.

12. The gate driver circuit of claim 1, wherein the blank start circuit includes:

a first transistor turned on in response to an input of a line sensing preparation signal;

a second transistor turned on in response to an input of a scan clock signal; and a third transistor turned on in response to an input of a carry clock signal, wherein the first transistor, the second transistor, the third transistor are connected in series with each other.

13. The gate driver circuit of claim 12, wherein the first transistor, the second transistor, and the third transistor are disposed between and connected to a Q node and a first high-potential voltage line for delivering the first high-potential voltage.

14. The gate driver circuit of claim 12, wherein each stage block is identified based on at least one of an identification number of the line sensing preparation signal input to the first transistor, an identification number of the scan clock signal input to the second transistor, or an identification number of the carry clock signal input to the third transistor.

15. The gate driver circuit of claim 1, wherein the signal output circuit includes:

an initializer configured to operate in response to an input of a panel on signal to discharge a Q node to a third low-potential voltage level;

a Q node controller configured to operate in response to an input of a front carry signal to charge the Q node to a first high-potential voltage level, and configured to operate in response to an input of a rear carry signal to discharge the Q node to the third low-potential voltage level;

a Q node and QH node stabilizer configured to discharge a Q node and a QH node to the third low-potential voltage level when a QB node has been charged to a second high-potential voltage level;

an inverter configured to change a voltage level of the QB node based on a voltage level of the Q node;

a QB node stabilizer configured to operate in response to an input of the rear carry signal to discharge the QB node to the third low-potential voltage level;

a carry signal output module configured to operate based on a voltage level of the Q node or a voltage level of the QB node to output a carry signal based on a carry clock signal or the third low-potential voltage; and a gate signal output module configured to operate based on the voltage level of the Q node or the voltage level of the QB node to output first to j-th gate signals based on first to j-th scan clock signals or a first low-potential voltage.

16. A display device comprising:

a display panel including sub-pixels respectively disposed at intersections of gate lines and data lines;

a gate driver circuit according to any one of claims 1 to 15, the gate driver circuit being configured to supply a scan signal to each gate line;

a data driver circuit configured to supply a data voltage to each data line; and a timing controller configured to control an operation of each of the gate driver circuit and the data driver circuit.

* * * * *